United States Patent
Wachi et al.

(10) Patent No.: US 8,660,502 B2
(45) Date of Patent: Feb. 25, 2014

(54) HIGH FREQUENCY ANTENNA SWITCH MODULE

(75) Inventors: Yusuke Wachi, Okegawa (JP); Takashi Kawamoto, Kodaira (JP); Yuta Sugiyama, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 161 days.

(21) Appl. No.: 13/409,451

(22) Filed: Mar. 1, 2012

(65) Prior Publication Data
US 2012/0252377 A1 Oct. 4, 2012

(30) Foreign Application Priority Data

Mar. 29, 2011 (JP) .................................. 2011-072089
Feb. 17, 2012 (JP) .................................. 2012-032922

(51) Int. Cl.
*H04B 1/44* (2006.01)
(52) U.S. Cl.
USPC .................. 455/83; 455/78; 455/80; 455/121; 455/252.1; 455/333; 455/103; 327/10; 327/408; 327/428; 330/10; 330/51; 330/107; 375/368; 363/98; 363/132
(58) Field of Classification Search
USPC ....................... 455/83, 78, 80, 121, 252.1, 333
See application file for complete search history.

(56) References Cited

U.S. PATENT DOCUMENTS

| | | | |
|---|---|---|---|
| 6,308,047 B1 * | 10/2001 | Yamamoto et al. | 455/73 |
| 7,020,453 B2 * | 3/2006 | Hidaka et al. | 455/333 |
| 7,123,898 B2 * | 10/2006 | Burgener et al. | 455/333 |
| 7,577,404 B2 * | 8/2009 | Hayashi | 455/78 |
| 7,729,674 B2 * | 6/2010 | Shie et al. | 455/201 |
| 8,150,454 B2 * | 4/2012 | Sanders | 455/553.1 |
| 8,295,784 B2 * | 10/2012 | Seshita | 455/83 |
| 8,467,738 B2 * | 6/2013 | Gorbachov | 455/73 |
| 2009/0023415 A1 | 1/2009 | Seshita | |

FOREIGN PATENT DOCUMENTS

| | | |
|---|---|---|
| JP | 2009-27487 A | 2/2009 |
| JP | 2010-103971 A | 5/2010 |

OTHER PUBLICATIONS

Jeongwon Cha et al. "Analysis and Design Techniques of CMOS Charge-Pump-Based Radio-Frequency Antenna-Switch Controllers", IEEE Transactions on Circuits and Systems -I, vol. 56, No. 5, May 2009, pp. 1053-1062.

* cited by examiner

*Primary Examiner* — Marceau Milford
(74) *Attorney, Agent, or Firm* — Miles & Stockbridge P.C.

(57) ABSTRACT

In a high frequency antenna switch module, an I/O interface generates various control signals for controlling a switch module on the basis of a system data signal and a system clock, a decoder generates a switch control signal SWCNT for controlling a switch in response to a control signal CNT in the control signals, a timing detector for switch-ports switching generates a switch-port switching detection signal t_sw in response to the switch control signal, a frequency control signal generator generates frequency control signals ICONT and CCONT in response to the signal t_sw, and a negative voltage generation circuit generates a negative voltage output signal NVG_OUT while switching the frequency of the clock signal generated in the negative voltage generation circuit to different frequencies in response to signals ICONT and CCONT. The switch switches the paths among the plural switch ports in response to the signals SWCNT and NVG_OUT.

20 Claims, 29 Drawing Sheets

TIMING CHART OF TIMING DETECTOR
FOR SWITCH-PORTS SWITCHING

TIMING DIAGRAM OF FREQUENCY CONTROL SIGNAL GENERATOR

HIGH FREQUENCY ANTENNA SWITCH MODULE

CLAIM OF PRIORITY

The present application claims priority from Japanese Patent Application JP 2011-072089 filed on Mar. 29, 2011, and Japanese Patent Application JP 2012-32922 filed on Feb. 17, 2012, those contents of which are hereby incorporated by reference into this application.

FIELD OF THE INVENTION

The present invention relates to a high frequency antenna switch module and, more particularly, to a high frequency antenna switch module for switching signal paths between a transmission/reception antenna and two or more transmission/reception circuits.

BACKGROUND OF THE INVENTION

A cellular phone system realizes highly-functional communication by voice communication, TV telephone, and the wireless Internet with a third-generation cellular phone and is further developing to realize higher speed and higher functions. To realize such various services, standards such as EDGE (Enhanced Data rate for GSM Evolution) obtained by improving the communication speed of GSM (Global System for Mobile Communication), W-CDMA (Wideband Code Division Multiple Access), and LTE (Long Term Evolution) have been devised.

With increase in the number of the frequency bands used and the number of users and diversification of the communication system, GSM of the 900 MHz band and DCS (Digital Cellular System) of the 1.8 GHz band are used in Europe. On the other hand, in the U.S., PCS (Personal Communication Service) of the 1.9 GHz band and GSM of 850 MHz are used. In addition, there are W-CDMA and LTE using 1.5 GHz, the 2 GHz band, and 2.5 GHz, and a cellular phone has to be used in multiple bands and multiple modes as precondition.

To be used in multiple bands and multiple modes as described above, a high frequency antenna switch module has to have a large-scale circuit such as a DP9T (Double Pole 9 Throw) circuit.

FIGS. 30A and 30B are circuit diagrams schematically showing a switch circuit constructed as an SPDT (Single Pole Double Throw) switch in a switch module. In the GSM and LTE, the TDD (Time Division Duplex) method is used. Consequently, transmission (TX) and reception (RX) have to be frequently switched. For example, in the case of transmission (FIG. 30B), transistors M261 and M264 are turned on by applying positive voltage. On the other hand, transistors M262 and M263 are turned off by applying negative voltage. By the operation, an RF signal from a transmission circuit TX1 is transmitted to an antenna ANT via the on transistor M261 and is emitted as radio wave from the antenna ANT to the air. To cut off a leak signal of the RF signal from the transmission circuit TX1, in a reception circuit RX1, the transistor M263 is turned off and the reception circuit RX1 is connected to the ground GND by the transistor M264. On the other hand, in the case of reception (FIG. 30A), the transistors M262 and M263 are turned on by applying positive voltage. On the other hand, the transistors M261 and M264 are turned off by applying negative voltage. By the operation, an RF signal (the instantaneous voltage value is a few μVpp to a few m Vpp) received from the antenna ANT is transmitted to the reception circuit RX1 via the on transistor M263 and is connected to an RFIC (Radio Frequency Integrated Circuit) on the outside of the switch module. To prevent leakage of an RF signal received from the antenna ANT to the transmission circuit TX1, the transistor M261 is turned off and the transistor M262 is connected to the ground GND.

The reason why the negative voltage is applied to the off switch as described above is as follows. Since the power of the RF signal supplied from TX1 to the switch becomes about 1W at maximum, the instantaneous voltage applied to the drain terminal or the source terminal of a transistor in the switch reaches a few Vpp. To maintain the off state of the transistor even when the voltage reaching a few Vpp is applied, it is necessary to apply the negative voltage of about, for example, −2.5 V to the off transistor.

FIG. 31 illustrates a high frequency antenna switch module having a general configuration. A high frequency antenna switch module (1) includes a switch (7) body such as the SPDT switch, an I/O interface (2) receiving a control data signal SDATA from a BBIC (Base-Band Integrated Circuit) of a portable terminal and a system clock SCLK and controlling starting of the switch module, switching of switch ports, setting of stand-by, and the like, a decoder (3) receiving a control signal CNT from the I/O interface and generating a switch control signal SWCNT adapted to actual switching of switches, and a negative voltage generation circuit (6) supplying a negative voltage output signal NVG_OUT to the switch (7).

For example, as described in the following literature of Jeongwon Cha et al., the negative voltage generation circuit (6) is construed by a clock generator, a charge pump circuit, and a capacitive element of large area. The charge pump circuit is driven by a clock generated by the clock generator, and negative charges output from the charge pump are accumulated in the capacitive element, thereby generating negative voltage.

Jeongwon Cha et al, "Analysis and Design Techniques of CMOS Charge-Pump-Based Radio-Frequency Antenna-Switch Controllers", IEEE Transactions on Circuits and Systems-I, Vol. 56, No. 5, May 2009, pp. 1053-1062

Japanese Patent Application Laid-Open Publication No. 2009-27487 discloses a technique of separately preparing a charge discharging path constructed by an FET (Field Effect Transistor) and a diode for a gate terminal of a transistor as a component of the switch and the GND terminal to prevent positive charges accumulated in a parasite capacitor Cgs between the gate terminal and the source terminal of the transistor in the switch from flowing in a charging capacitor in a negative voltage circuit, thereby suppressing rise in a negative voltage generated at the time of switching ports of the switch and shortening the time of the switch ports switching.

A ninth embodiment in Japanese Patent Application Laid-Open Publication No. 2010-103971 discloses another technique. A fluctuation in a boosted voltage is detected by a comparator. When the boosted voltage value fluctuates to a predetermined value, the frequency of a clock generator in a booster circuit is increased and operated to promptly reset the boosted voltage to the original value. When the boosted voltage rises to a predetermined value, the clock frequency is reset to the original frequency. With the configuration, by increasing the clock frequency only at the timing of the switch ports switching, without enlarging the area of the charging capacitor Cc in the booster circuit, increase in power consumption can be suppressed.

SUMMARY OF THE INVENTION

Since the power is supplied from a mounted battery to an IC and a switch in a portable terminal, the BBIC, RFIC, PA (Power Amplifier) and the like assembled in the portable terminal are requested to realize low power consumption, and a high frequency antenna switch module including a negative voltage generation circuit is also requested to realize low power consumption.

In the negative voltage generation circuit, when the clock is stopped, charges are gradually leaked from the capacitive element, and the negative voltage value rises (close to 0 V). Consequently, the clock generator has to be always operated. Therefore, the high frequency antenna switch module is a switch circuit for switching signal paths between a transmission/reception antenna and two or more transmission/reception circuits and always consumes current.

Further, since the high frequency antenna switch module is mounted in a portable terminal or the like to be mass-produced, which is typified by a cellular phone, it has to be provided at low cost to the market.

Consequently, in a high frequency antenna switch module, a switch using an HEMT (High Electron Mobility Transistor) having high resistivity of a conventional substrate and low signal loss is employed. However, in recent years, the switch is being replaced with an SOI (Silicon On Insulator) switch using inexpensive silicon.

In a conventional high frequency antenna switch module, a switch body, a decoder, and a negative voltage generation circuit are generated as separate parts and assembled in a module package. To reduce assembly cost, a module obtained by mounting all of the circuit blocks on a single semiconductor integrated circuit is being demanded. Further, to reduce the cost, the semiconductor circuit is demanded to be realized in small chip area. Since power is supplied to a portable terminal from a battery mounted in the terminal, the BBIC, RFIC, PA, and the like assembled in the portable terminal are requested to realize low power consumption, and a high frequency antenna switch module including the negative voltage generation circuit is also requested to realize low power consumption. In short, the high frequency antenna switch module is requested to realize lower power consumption and smaller area while satisfying switch port switching time based on standards such as W-CDMA, LTE, and GSM.

FIGS. 32 and 33 are diagrams for explaining means for applying a negative voltage output signal NVG_OUT generated by a negative voltage generation circuit NVG (6) to a switch (7) and problems which occur at that time. The switch (7) includes an SPST (Single Pole Single Throw) switch (70) as a switch body (also called a switch core) and a level shifter (71). To simplify the explanation, the switch core is expressed as SPST in FIG. 32. However, the switch core may have the other configuration such as SPDT. There is also a case that plural switch cores are provided and the antenna ANT is connected to each of the switch cores.

The level shifter (71) is a circuit block for shifting a switch control signal SWCNT having voltage level VDD-GND from the decoder (3) to gate control signals GCNT and NGCNT having voltage level VDD-NVG_OUT. That is, the level of the switch control signal SWCNT is the power supply voltage VDD at the high level and is GND at the low level. On the other hand, the level of the gate control signals GCNT and NGCNT is VDD at the high level and is NVG_OUT at the low level. The level shifter (71) is constructed by three circuits: an inverter made by a transistor MN 711 whose source terminal is grounded and a transistor MP 713 whose source terminal is connected the power source of VDD; an inverter made by a transistor MN 712 whose source terminal is grounded and a transistor MP 714 whose source terminal is connected to the power source of VDD; and a differential-input cross-coupled latch made by transistors MN 713 and MN 714 whose source terminals are connected to the negative voltage generation circuit NVG (6) and transistors MP 715 and MP 716 whose source terminals are connected to the voltage source of VDD. Differential signals of the switch control signal SWCNT having the signal level VDD-GND are generated by the two inverters and supplied to the differential-input cross-coupled latch. As outputs of the cross-coupled latch, the signals GCNT and NGCNT having the signal level VDD-NVG_OUT are generated. The signal GCNT is connected to a through transistor MN 701 of the SPST switch (70), and the signal NGCNT is connected to a shunt transistor MN 700. At this time, charges accumulated in a gate-source capacitor Cgs of the transistor MN 700 flow as Igate to a charging capacitor Cc of the negative voltage generation circuit NVG (6) via the transistor MN 713.

FIG. 33 is a diagram schematically showing time waveforms at the nodes in FIG. 32. When the switch control signal SWCNT is at the low level until time t<t1, the transistors MP 715 and MN 714 in the differential-input cross-coupled latch are on, and the transistors MP 716 and MN 713 are off, so that the gate control signal GCNT is at the low level and the signal NGNT is at the high level. At this time, the transistor MN 700 of the SPST switch (70) is on and the transistor MN 701 is off, so that an ANT port and an RF1 port in the SPST (70) switch are separated. Since VDD is applied to the gate terminal of the transistor MN 700, charges expressed by the product of VDD and the capacitance value Cgsn of a parasite capacitor Cgs between the gate and the source of the transistor MN 700 are accumulated in the parasite capacitor Cgs. The transistors MN 700 and MN 701 constructing the SPST switch (70) have gate width much wider than that of the transistors MN 713, MN 714, MP 715, and MP 716 in order to reduce on resistance at the time of switch on. Consequently, large charges are accumulated in the parasite capacitor Cgs between the gate and the source of the transistor MN 700.

When the switch control signal SWCNT changes from the low level to the high level at t=t1, the transistors MP 716 and MN 713 in the differential-input cross-coupled latch are turned on and the transistors MP 715 and MN 714 are turned off, so that the gate control signal GCNT becomes the high level and the signal NGCNT becomes the low level. At this time, the transistor MN 700 in the SPST switch 70 is turned off and the transistor MN 701 is turned on, so that the ANT port and the RF port of the SPST switch 70 are connected. At the moment when the transistor MN 700 is changed from the on state to the off state, that is, at the moment when the voltage applied to the gate terminal of the transistor MN 700 is switched from VDD to NVG_OUT, the charges accumulated in the capacitor Cgs between the gate and the source of the transistor MN 700 flow as Igate to the charging capacitor Cc in the negative voltage generation circuit NVG (6) via the transistor MN 713. Since negative charges are accumulated in the charging capacitor Cc, when the positive charges in the capacitor Cgs of the transistor MN 700 flow as Igate, a phenomenon occurs such that the negative voltage value of NVG_OUT as an output of the negative voltage generation circuit (6) rises (close to 0 V) when t<t1. After that, the negative voltage value of NVG_OUT returns to the negative voltage value before the switching of the switch control signal SWCNT by recharging the charging capacitor Cc with negative charges by the clock generator and the charge pump in the negative voltage generation circuit (6).

Time t_A since the switch timing t1 of the switch control signal SWCNT until the negative voltage value which rises returns to the original negative voltage value is defined as "switch-ports switching time". The switch-ports switching time t_A has to be conformed with the standard such as W-CDMA or GSM and the specifications of a portable terminal set manufacturer.

To shorten the switch-ports switching time, (i) the capacitance value of the charging capacitor Cc in the negative voltage generation circuit (6) is increased, and (ii) the clock frequency of the clock generator in the negative voltage generation circuit (6) is increased.

With respect to (i), even when the positive charges of the capacitor Cgs between the gate and source of the transistor MN 700 in the SPST switch (70) flow in, by increasing the size of the charging capacitor Cc to the degree at which no influence is exerted, the voltage rise amount of NVG_OUT is decreased and time until the negative voltage value returns to the original value is shortened, that is, the switch-ports switching time is shortened. However, since increase in the capacitance value of the charging capacitor Cc means increase in chip area, the unit price of the chip increases, and it is unpreferable. With respect to (ii), when increase in the clock frequency of the clock generator is increased, the frequency of supplying negative charges to the charging capacitor Cc by the charge pump is improved. By shortening time until the negative voltage value of NVG_OUT returns to the original value, the switch-ports switching time is shortened. However, increase in the clock frequency of the clock generator causes increase in current consumption, and it unpreferably causes shortening in use time of a portable terminal.

In the configuration of Japanese Patent Application Laid-Open Publication No. 2009-27487, although charges can be passed to another discharge path to the degree of about 0.6 to 0.7 V at which a diode can maintain the on state, when the voltage value becomes 0.6 V or less, the discharge path is turned off. After that, the positive charges accumulated in the capacitor Cgs in the transistor flow in the charging capacitor Cc, so that the effect of shortening the switch-ports switching time is limited. In another embodiment of Japanese Patent Application Laid-Open Publication No. 2009-27487, also in the case where the voltage value is 0.6 V or less, charges are passed to another discharge path. Consequently, the diode is connected, not to GND, but to an output terminal of a second negative voltage generation circuit. However, since two negative voltage generation circuits have to be prepared, the area is increased, and the unit price of the chip rises.

In the configuration of the ninth embodiment of Japanese Patent Application Laid-Open Publication No. 2010-103971, the frequency of the clock generation is increased after a fluctuation in a boosted voltage value is detected. Consequently, there is predetermined lag time since a control signal is received until the clock frequency of the clock generator is increased, so that the effect of shortening of the switch-ports switching time is limited.

As described above, the proposed techniques have a problem such that it is difficult to realize a high frequency antenna switch module satisfying all of conditions of short switch-ports switching time, low power consumption, and small chip area.

An object of the present invention is to address the problem and to provide a high frequency antenna switch module technique satisfying all of shortened switch-ports switching time, low power consumption, and small chip area.

The above and other objects and novel features of the present invention will become apparent from the description of the specification and the appended drawings.

A representative one of inventions disclosed in the application will be briefly described as follows.

A representative high frequency antenna switch module of the present invention having a switch for switching paths among plural switch ports includes: an I/O interface for generating a plural kinds of control signals for controlling the switch module on the basis of a system data signal and a system clock received from external devices; a decoder for generating a switch control signal for controlling the switch in response to a control signal to switch the switch ports in the plural kinds of control signals; a timing detector for switch-ports switching for generating a switch-ports switching detection signal in response to a switching timing of the control signal to switch the switch ports; a frequency control signal generator for generating a plurality of frequency control signals for changing frequency in response to the switch-ports switching detection signal; and a negative voltage generation circuit for generating a clock signal of frequency which varies according to the frequency control signals and generating a negative voltage output signal on the basis of the clock signal. The negative voltage generation circuit temporarily increases the frequency of the clock signal at the switch-ports switching timing in response to the frequency control signals, and the switch switches the paths among the plural switch ports in response to the switch control signal and the negative voltage output signal.

Effects obtained by the representative one of the inventions disclosed in the application will be briefly described as follows. According to the present invention, a high frequency antenna switch module capable of detecting a timing of switching ports of a switch synchronously or before an actual switching timing and satisfying all of effects of shortening of the switch-ports switching time, reduction in power consumption, and reduction in semiconductor chip area can be realized.

DETAILED DESCRIPTION OF THE EMBODIMENTS

Figure 1:
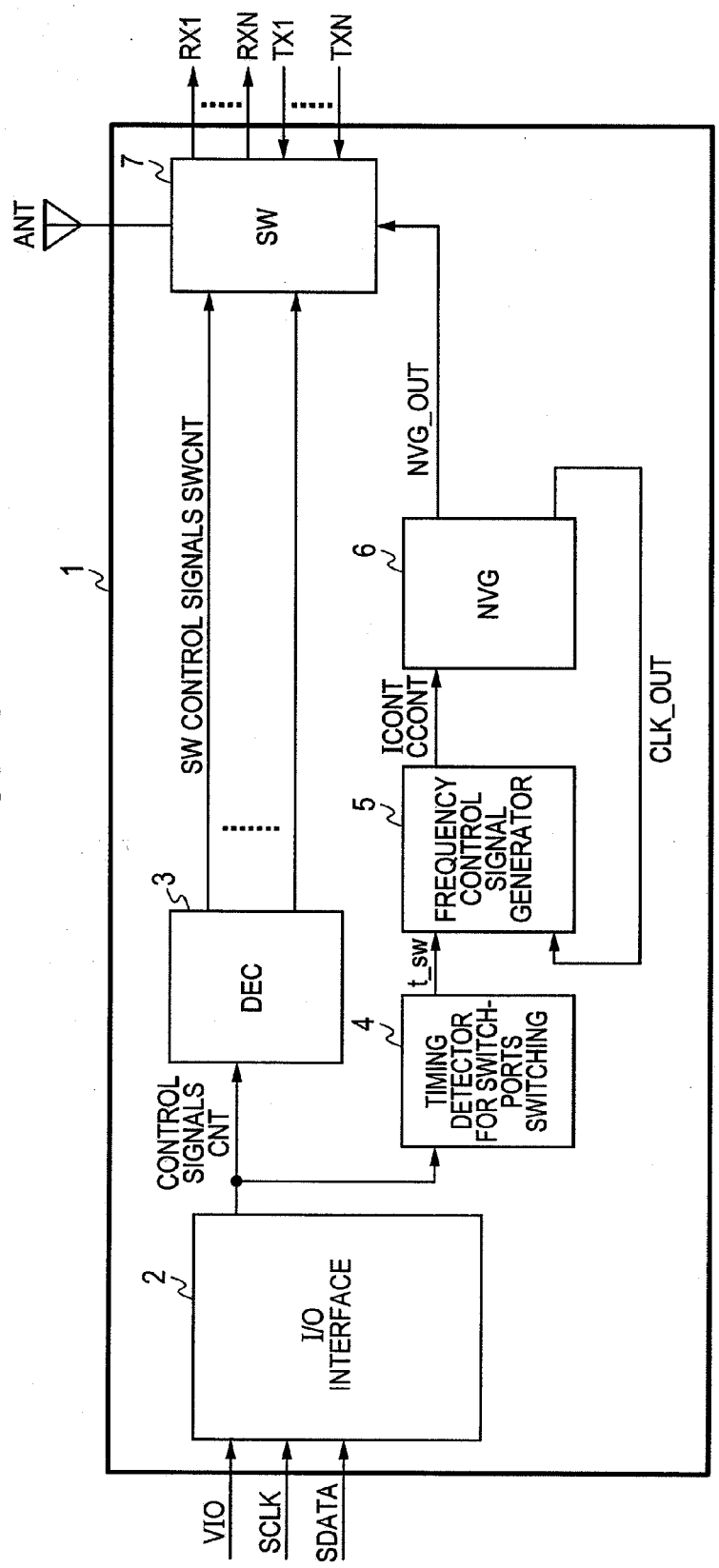
FIG. 1 illustrates the configuration of a high frequency antenna switch module of a first embodiment of the present invention.

Representative embodiments of the present invention will now be described in detail.

Outline of Embodiments of the Present Invention

First, representative embodiments will be described. Reference numerals of the drawings referred to in parentheses in the description of the outline merely illustrate components designated with the reference numerals included in the concept of the components.

A high frequency antenna switch module as a representative embodiment of the present invention, having a switch for switching paths among plural switch ports includes:

an I/O interface for generating a control signal for controlling the high frequency antenna switch module on the basis of a control data signal SDATA and a system clock received from external devices;

a decoder for outputting a switch control signal for switching the switch ports of the switch on the basis of a the control signal from the I/O interface;

a timing detector for switch-ports switching for outputting a switch-ports switching timing detection signal on the basis of the control signal;

a frequency control signal generator connected to the timing detector for switch-ports switching; and a negative voltage generation circuit connected to the frequency control signal generator and generating and outputting a negative voltage output signal.

The frequency control signal generator outputs a plural frequency control signals to switch a clock signal in the negative voltage generation circuit to two or more clock frequencies on the basis of the switch-ports switching timing detection signal, the negative voltage generation circuit increases the clock frequency on the basis of the frequency control signals for predetermined time since input of the switch-ports switching timing detection signal to the frequency control signal generator, and the switch switches the paths among the plural switch ports in response to the switch control signal and the negative voltage output signal.

The I/O interface receives a control data signal SDATA from a control circuit on the external devices of the high frequency antenna switch module, a system clock SCLK, and interface power supply voltage VIO and generates a control signal CNT for controlling the switch. The decoder receives the control signal CNT generated from the I/O interface and generates a switch control signal SWCNT for switching the switch ports of the switch. The timing detector for switch-ports switching detects a switching timing of the switch ports of the switch from the control signal CNT generated from the I/O interface and generates a switch-ports switching timing detection signal t_sw.

The frequency control signal generator receives the switch-ports switching timing detection signal t_sw from the timing detector for switch-ports switching, and generates frequency control signals ICONT and CCONT for switching the clock signal in the negative voltage generation circuit to two or more frequencies. Each of the frequency control signals ICONT and CCONT is a digital value of one or more bits, for increasing the clock frequency generated by the clock generator in the negative voltage generation circuit only for predetermined time in response to the switch-ports switching timing detection signal t_sw from the timing detector for switch-ports switching. After lapse of the predetermined time since the response to switch-ports switching timing detection signal t_sw, the frequency control signals ICONT and CCONT return to the digital values before detection of the switch-ports switching timing detection signal t_sw. That is, after the negative voltage output signal NVG_OUT returns to the original value before the switch-ports switching timing, the clock frequency of the clock generator in the negative voltage generation circuit returns to the low frequency before the detection of the switch-ports switching timing detection signal t_sw.

The negative voltage generation circuit receives the frequency control signals ICONT and CCONT from the frequency control signal generator and generates the negative voltage output signal NVG_OUT. The switch controls the on/off state of a transistor in the switch by the switch control signal control signal SWCNT from the decoder and the negative voltage output signal NVG_OUT from the negative voltage generation circuit to switch the signal paths to an antenna ANT, of input signals TX1 to TXN and output signals RX1 to RXN input/output to/from at least two RF ports from a transmission circuit and a reception circuit connected to the high frequency antenna switch module.

In the embodiment, the timing of switching the ports of the switch can be detected before the ports are actually switched. On the basis of the detected timing, the frequency of the clock generator in the negative voltage generator can be raised only for predetermined time. As a result, while suppressing increase in current consumption and increase in chip area, rise of the voltage value of the negative voltage output signal NVG_OUT accompanying the switching of the switch ports of the switch can be promptly reset to the original negative voltage value. That is, the high frequency antenna switch module satisfying both effects of shortened time of the switch-ports switching and reduced power consumption can be realized without substantially increasing the area of the semiconductor chip. In the embodiment, without increasing the capacitance value, both of the effects can be realized by adding only a digital circuit without substantially increasing the semiconductor chip area.

In an exemplary embodiment, by providing the frequency control signal generator with a counter which receives the clock signal CLK_OUT generated from the clock generator in the negative voltage generation circuit and counts N pieces of clocks of the clock signal CLK_OUT, the frequency control signal generator can generate a timing of increasing the clock frequency of the clock generator in response to the switch-ports switching timing detection signal t_sw.

In another exemplary embodiment, the I/O interface receives the control data signal SDATA from a control circuit on the outside of the high frequency antenna switch module, the system clock SCLK, and the interface power supply voltage VIO and generates the control signal CNT for controlling the switch and an enable signal IO_EN indicating that the I/O interface is in an active state.

The frequency control signal generator receives the enable signal IO_EN from the I/O interface and generates the frequency control signals ICONT and CCONT for switching the clock signal from the clock generator in the negative voltage generation circuit to two or more frequencies. The frequency control signal generator also receives the switch-ports switching timing detection signal t_sw. After counting predetermined time since the signal t_sw becomes high level, the frequency control signals ICONT and CCONT return to the original digital values before detection of the enable signal IO_EN. Specifically, in the foregoing embodiment, a trigger signal to increase the clock signal of the clock generator is the enable signal IO_EN, and a trigger signal to reset the clock frequency of the clock generator to the original frequency is the switch-ports switching timing detection signal t_sw.

In another exemplary embodiment, the high frequency antenna switch module includes an I/O interface, a decoder, a timing detector for switch-ports switching, a frequency control signal generator, a negative voltage generation circuit, a switch, and a switching pattern detector.

The switching pattern detector detects a switching pattern of the control signal CNT from the I/O interface and generates a switching pattern detection signal PTT.

The frequency control signal generator receives the switch-ports switching timing detection signal t_sw from the timing detector for switch-ports switching and the switching pattern detection signal PTT from the switching pattern detector, and generates frequency control signals ICONT and CCONT for switching the clock signal in the negative voltage generation circuit to three or more frequencies. Each of the frequency control signals ICONT and CCONT is a digital value of one or more bits, for increasing the clock frequency generated by the clock generator in the negative voltage generation circuit only for predetermined time in response to the switch-ports switching timing detection signal t_sw from the timing detector for switch-ports switching. After lapse of the predetermined time since the response to the switch-ports switching timing detection signal t_sw, the frequency control signals ICONT and CCONT return to the digital values before detection of the switch-ports switching timing detection signal t_sw. That is, after the negative voltage output signal NVG_OUT returns to the original negative voltage output signal NVG_OUT before the switch-ports switching timing, the clock frequency of the clock generator in the negative voltage generation circuit returns to the low frequency before the detection of the switch-ports switching timing detection signal t_sw.

In the embodiment, the timing of switching the ports of the switch can be detected synchronously with or before the actual switching timing, and the high frequency antenna switch module simultaneously satisfying the effects of shortening of the time of the switch-ports switching, reduction in power consumption, and reduction of the area of the semiconductor chip can be realized.

Details of Embodiments of the Invention

Next, the embodiments will be described more specifically. In all of the drawings for explaining best modes for carrying out the invention, the same reference numerals are designated to parts having the same functions as those of the above-described drawings, and their description will not be repeated.

First Embodiment

A high frequency antenna switch module according to a first embodiment of the present invention will be described with reference to the FIGS. 1 to 11. For explanation of configuration parts similar to those of the conventional art, FIG. 32 will be also referred to.

Configuration of High Frequency Antenna Switch Module

FIG. 1 is a diagram illustrating the configuration of a high frequency antenna switch module (1) of the first embodiment of the present invention.

The high frequency antenna switch module (1) illustrated in FIG. 1 includes an I/O interface (2), a decoder (3), a timing detector for switch-ports switching (4), a frequency control signal generator (5), a negative voltage generation circuit (6), and a switch (7).

The I/O interface (2) receives a control data signal SDATA from a control circuit disposed on the outside of the high frequency antenna switch module (1), a system clock SCLK, and interface power supply voltage VIO and generates a control signal CNT for controlling the switch (7). The decoder (3) receives the control signal CNT generated from the I/O interface (2) and generates a switch control signal SWCNT for switching the switch ports of the switch (7).

The timing detector for switch-ports switching (4) detects a switching timing of the switch ports of the switch (7) from the control signal CNT generated from the I/O interface (2) and generates a switch-port switching timing detection signal t_sw.

The frequency control signal generator (5) receives the switch-port switching timing detection signal t_sw from the timing detector for switch-ports switching (4), and generates frequency control signals ICONT and CCONT for switching the clock signal in the negative voltage generation circuit (6) to two or more clock frequencies. Each of the frequency control signals ICONT and CCONT has a digital value of one or more bits, for increasing the clock frequency generated by a clock generator (61) in the negative voltage generation circuit (6) only for predetermined time in response to the switch-ports switching timing detection signal t_sw from the timing detector for switch-ports switching (4). After lapse of the predetermined time since the response to the switch-ports switching timing detection signal t_sw, the frequency control signals ICONT and CCONT return to the digital values before detection of the switch-ports switching timing detection signal t_sw. That is, the clock frequency of the clock generator (61) in the negative voltage generation circuit (6) returns to the low frequency before the detection of the switch-ports switching timing detection signal t_sw.

The negative voltage generation circuit (6) receives the frequency control signals ICONT and CCONT from the frequency control signal generator (5), controls the clock frequency of the clock generator (61) in the negative voltage generation circuit (6), and generates the negative voltage output signal NVG_OUT.

The switch (7) receives a switch control signal SWCNT from the decoder and the negative voltage output signal NVG_OUT from the negative voltage generation circuit (6) and performs on/off control on a transistor in the switch (7) to switch the communication paths among an RF port and the switch ports of the antenna ANT. Specifically, the switch (7) switches the communication paths of input/output signals among at least one TX ports (TX1 to TXN) of an RF signal connected to external devices, at least one RX ports (RX1 to RXN), and the antenna ANT.

Next, the detailed operation principle of the high frequency antenna switch module (1) will be described together with detailed explanation of the blocks with reference to the time chart.

Timing Detector for Switch-Ports Switching

Figure 2:
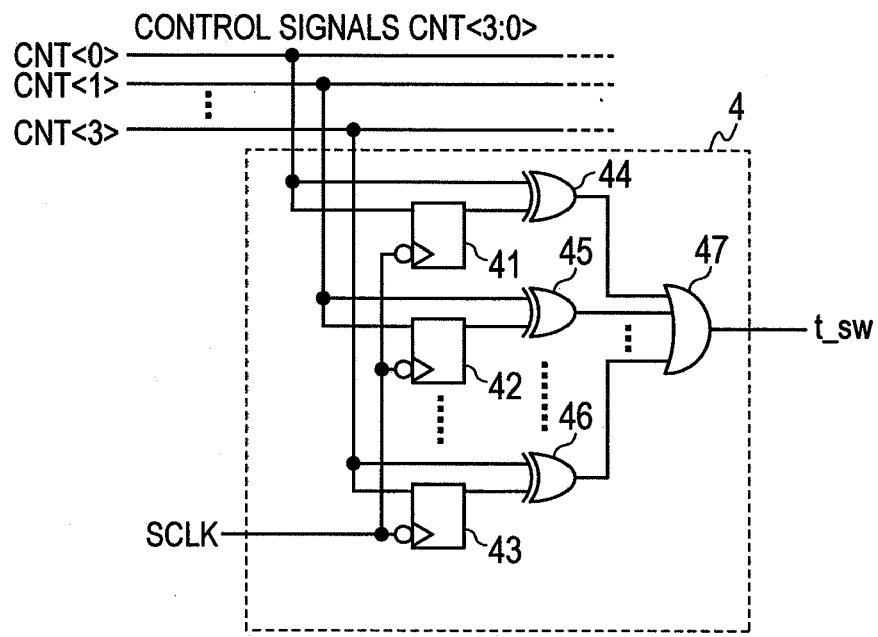
FIG. 2 is a diagram illustrating the configuration of a timing detector for switch-ports switching included in the high frequency antenna switch module shown in FIG. 1.

FIG. 2 is a diagram illustrating the configuration of the timing detector for switch-ports switching (4), for detecting a switch-ports switching timing from a control signal CNT<3:0> from the I/O interface circuit (2) in the high frequency antenna switch module (1) according to the first embodiment of the invention shown in FIG. 1. The control signal CNT<3:0> expresses a control signal of four bits of control signals <0> to <3>. For example, an expression of "0110" indicates a state where CNT<0>=0, CNT<1>=1, CNT<2>=1, and CNT<3>=0.

Although the control signal CNT<3:0> in the first embodiment of FIG. 2 is a digital signal of four bits, the number of bits changes according to the number of ports of the switch and the control logic and is not limited to four bits.

The timing detector for switch-ports switching (4) shown in FIG. 2 includes four fall-edge DFFs (Delay Flip Flops) (41) to (43), the number of which is the same as the number of bits of the control signal CNT, four 2-input exclusive OR circuits EXOR (44) to (46) the number of which is similarly the same, and one 4-input OR circuit OR (47). In the diagram, the fall-edge DFF and the 2-input exclusive OR circuit EXOR corresponding to a not-shown control signal are not illustrated. To the input terminals of the four fall-edge DFFs (41), (42), and (43), the control signals CNT<0>, CNT<1>, and CNT<3> are supplied, respectively. To the clock input terminals of the DFFs (41) to (43), a system control SCLK from a control circuit disposed on the outside of the high frequency antenna switch module (1) is supplied. To the 2-input exclusive OR circuit EXOR (44), CNT<0> and an output signal of the DFF (41) are supplied. To the 2-input exclusive OR circuit EXOR (45), CNT<1> and an output signal of the DFF (42) are supplied. To the 2-input exclusive OR circuit EXOR (46), CNT<3> and an output signal of the DFF (43) are supplied. To the one 4-input OR circuit OR (47), output signals of the 2-input exclusive OR circuits EXOR (44) to (46) are supplied.

Figure 3:
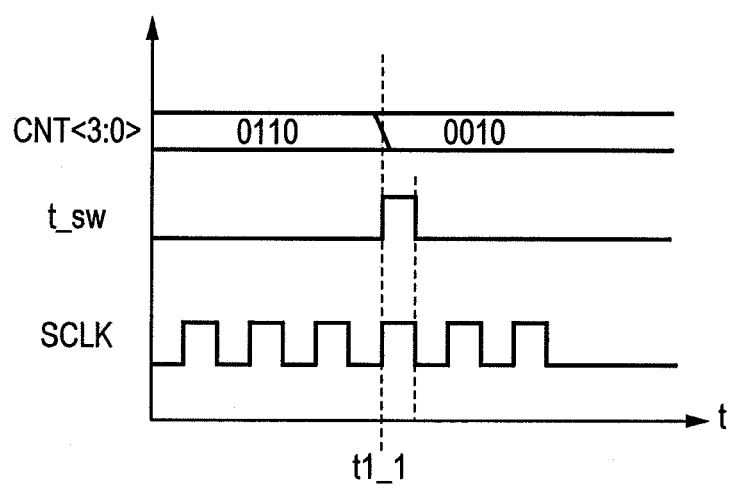
FIG. 3 is a timing chart for explaining the internal operation of the timing detector for switch-ports switching illustrated in FIG. 2.

FIG. 3 is a timing chart for explaining the internal operation of the timing detector for switch-ports switching (4) illustrated in FIG. 2. First, when the values of the control signal CNT<3:0> of the high-frequency antenna switch module (1) are switched from "0110" to "0010" synchronously with the rising edge of the system clock SCLK at the timing of t=t11, a high-level signal of CNT<1> and a low-level signal as a value of the immediately preceding clock SCLK stored in the DFF (42) are supplied to the EXOR (45) in the timing detector for switch-ports switching (4). Consequently, the output value of the EXOR (45) changes from the low level to the high level and maintains the high level until the next trailing edge of SCLK. Accordingly, the output value of the 4-input OR circuit OR (47) changes from the low level to the high level and maintains the high level until the next trailing edge of SCLK. It is therefore understood from the above that the timing detector for switch-ports switching (4) can output the switch-ports switching timing detection signal t_sw which is at the high level only for the half cycle of SCLK since the signal value of the control signal CNT switches.

The reason why the DFFs (41) to (43) are of the fall-edge trigger type is because there is the case that the I/O interface (2) leaves SCLK and SDATA at the low level (cutoff) to suppress power consumption after switching the control signal CNT of the switch. If DFFs of the rise-edge trigger type are used in the above case, since SCLK is not supplied, the updated value of CNT<1> cannot be stored in the DFF (42), and the switch-ports switching timing detection signal t_sw may remain at the high level.

Frequency Control Signal Generator

Figure 4:
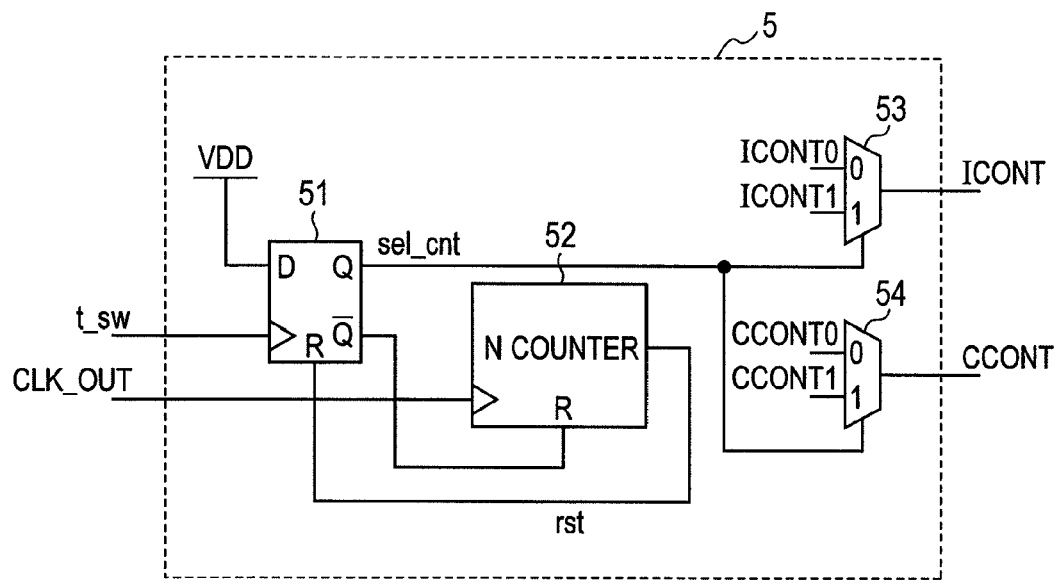
FIG. 4 is a diagram illustrating the configuration of a frequency control signal generator included in the high frequency antenna switch module shown in FIG. 1.

FIG. 4 is a diagram illustrating the configuration of the frequency control signal generator (5) receiving the switch-ports switching timing detection signal t_sw and generating the frequency control signals ICONT and CCONT for switching the clock signal in the negative voltage generation circuit (6) to two or more clock frequencies, in the high frequency antenna switch module (1) of the first embodiment of the invention shown in FIG. 1.

The frequency control signal generator (5) illustrated in FIG. 4 includes a DFF (51), two 2-input selectors (53) and (54), and an N counter (52). To an input terminal D of the DFF (51), power supply voltage VDD is supplied. To a CLK input terminal of the DFF (51), the switch-ports switching timing detection signal t_sw is supplied. To a reset terminal R of the DFF (51), an output signal rst of the N counter (52) is supplied. To the input terminals of the 2-input selector (53), bias current adjustment values ICONT0 and ICONT1 as digital values of arbitrary number of bits are supplied. To the input terminals of the other 2-input selector (54), load capacitance adjustment values CCONT0 and CCONT1 as digital values of arbitrary number of bits are supplied. Each of the two 2-input selectors has a selector terminal for selecting one of the digital values connected to the two input terminals as an output. To the selector terminal, sel_cnt as an output from an output terminal Q of the DFF (51) is supplied. To the input terminal of the N counter (52), a clock signal CLK_OUT generated from the clock generator (61) (shown in FIG. 6) in the negative voltage generation circuit (6) is supplied. To a reset terminal R, an inversion signal of sel_cnt output from the inversion output terminal Q of the DFF (51) is supplied.

Figure 5:
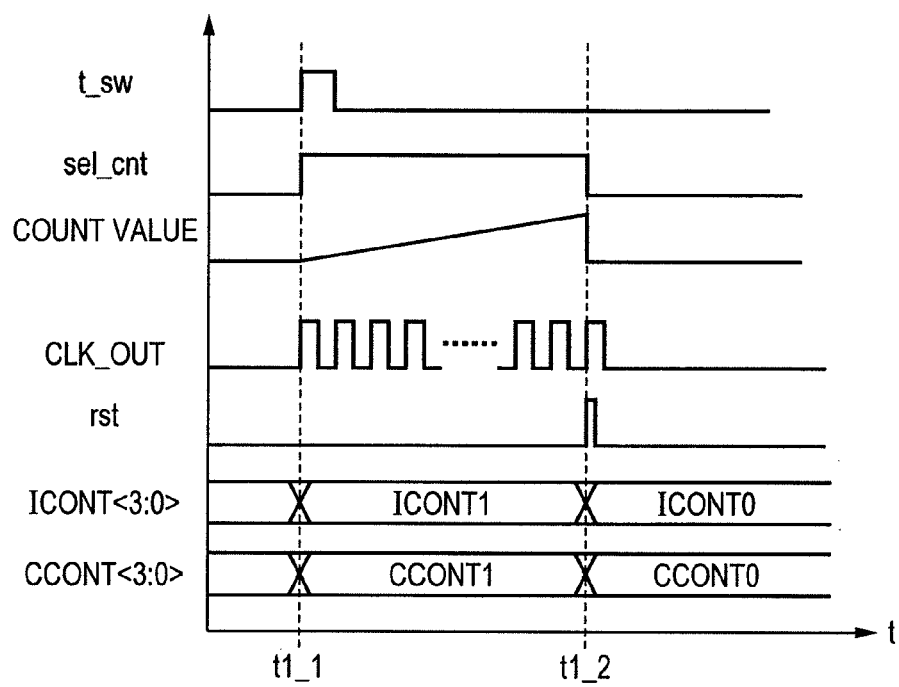
FIG. 5 is a timing chart for explaining the internal operation of the frequency control signal generator illustrated in FIG. 4.

FIG. 5 is a timing chart for explaining the internal operation of the frequency control signal generator (5) illustrated in FIG. 4. Using the switch-ports switching timing detection signal t_sw from the timing detector for switch-ports switching (4) at t=t1_1 as a trigger, the output sel_cnt of the DFF (51) changes from the low level to the high level. In response to the switch from the low level to the high level of sel_cnt, the outputs ICONT and CCONT of the 2-input selectors (53) and (54) switch from ICONT0 and CCONT0 to ICONT1 and CCONT1, respectively. On the other hand, in response to the switch from the low level to the high level of sel_cnt, reset of the N counter (52) is cancelled, and counting of the rising edge of the clock signal CLK_OUT from the clock generator (61) (shown in FIG. 6) is started. For example, in the case where the count value N of the N counter is 64, when the N counter counts the clock edges at which 64 signals rise almost perpendicularly, that is, at the time of t=t1_2, the output signal rst of the N counter changes from the low level to the high level. Accompanying the switch from the low level to the high level of the output signal rst, sel_cnt as an output signal of the DFF (51) changes again from the high level to the low level, and the outputs ICONT and CCONT of the selectors (53) and (54) become ICON0 and CCONT0, respectively. Since the inversion signal of sel_cnt, that is, a high-level signal is supplied to the reset terminal R of the N counter, the count value in the N counter is initialized and a standby state is set. When the clock frequency in the case where ICONT1 and CCONT1 are supplied to the clock generator (61) is 5 MHz, the time required for the N counter to count 64 clock edges is 12 µs. It is therefore understood that the frequency control signal generator (5) can output the control signals ICONT and CCONT only for the time of 12 µs. The count number N is not limited to 64, and can be properly set on the basis of the technical idea of the present invention.

Negative Voltage Generation Circuit

Figure 6:
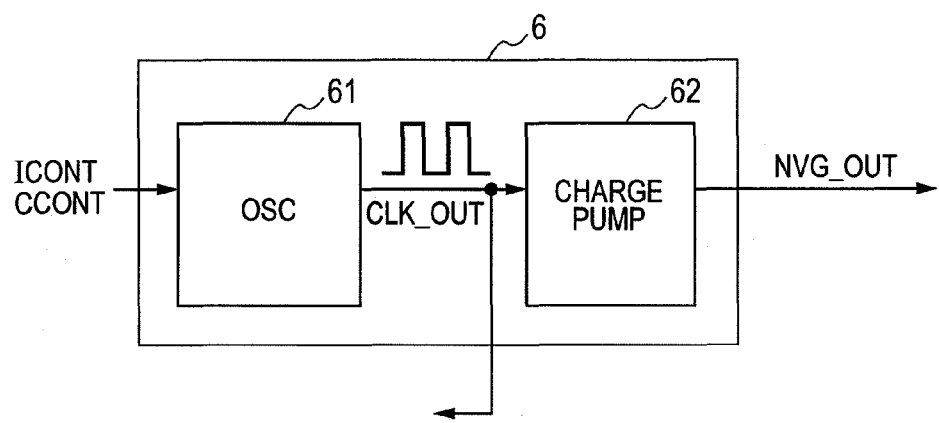
FIG. 6 is a diagram illustrating the configuration of a negative voltage generation circuit included in the high frequency antenna switch module shown in FIG. 1.

FIG. 6 is a diagram illustrating the configuration of the negative voltage generation circuit (6) generating the negative voltage output signal NVG_OUT, in the high frequency antenna switch module 1 of the first embodiment of the present invention shown in FIG. 1.

The negative voltage generation circuit (6) shown in FIG. 6 includes the clock generator (61) and a charge pump circuit (62). The frequency control signals ICONT and CCONT from the frequency control signal generation circuit (5) are supplied to the clock generator (61). The clock generator (61) generates the clock signal CLK_OUT of the frequency based on the digital values of the signals ICONT and CCONT, and the clock signal CLK_OUT of the clock generator (61) is supplied to the charge pump circuit (62). The clock signal CLK_OUT of the clock generator (61) is also supplied to the frequency control signal generation circuit (5).

Figures 7A, 7B:
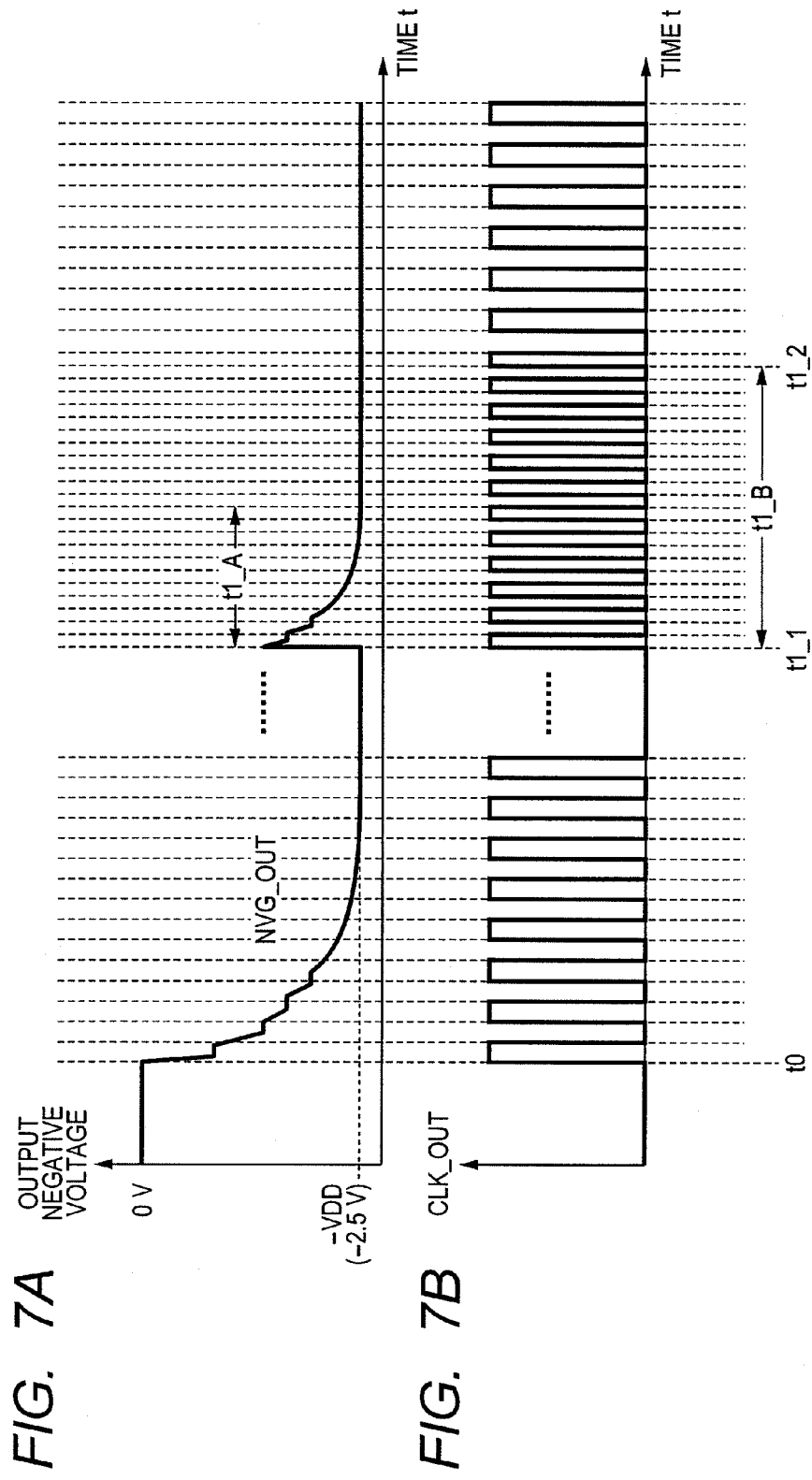
FIG. 7A is a diagram showing convergence process of a negative voltage output signal NVG_OUT generated by the negative voltage generation circuit illustrated in FIG. 6.
FIG. 7B is a diagram showing convergence process of a negative voltage output signal NVG_OUT generated by the negative voltage generation circuit illustrated in FIG. 6.
Figure 9:
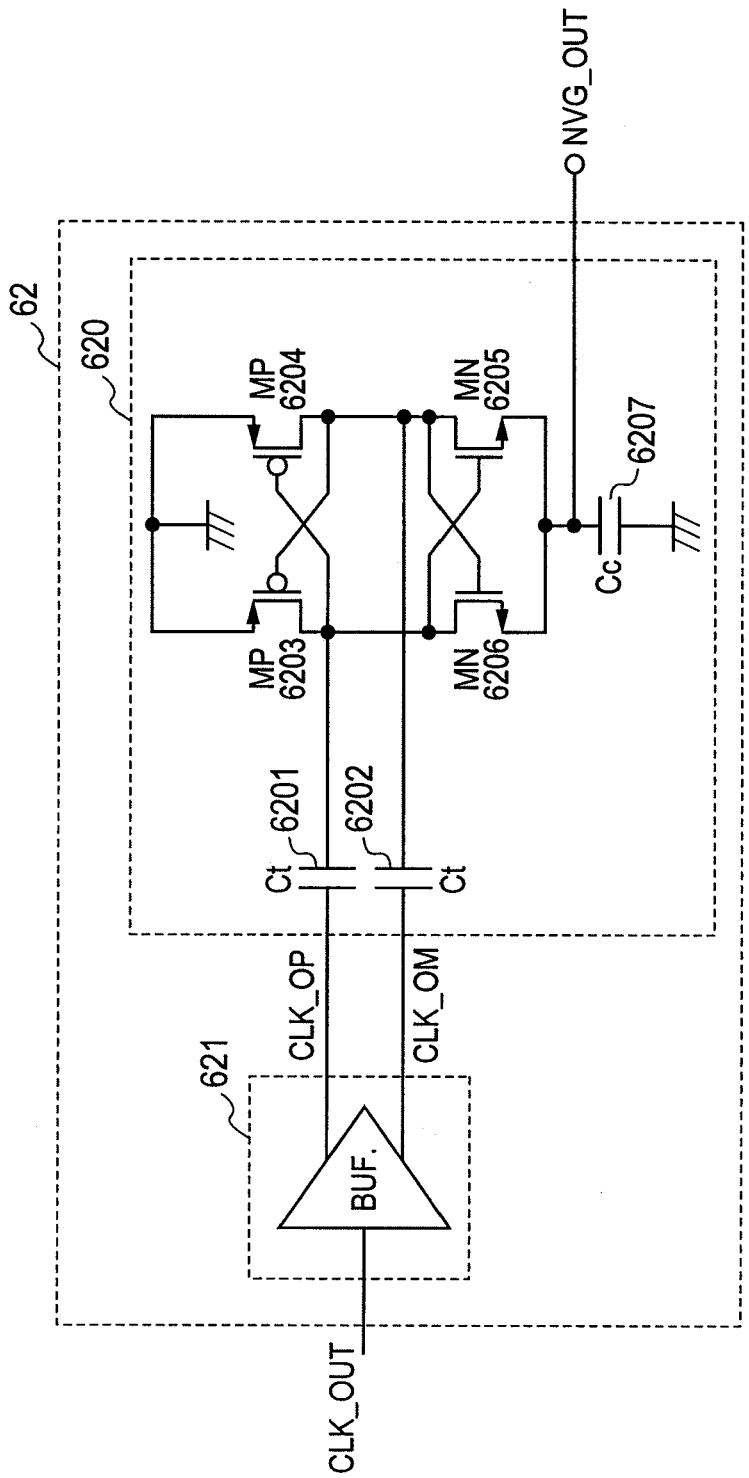
FIG. 9 is a diagram illustrating the configuration of a charge pump included in the negative voltage generation circuit shown in FIG. 6.

FIGS. 7A and 7B are diagrams schematically showing the clock signal CLK_OUT as an output of the clock generator (61) and convergence process of the negative voltage output signal NVG_OUT as an output of the charge pump (62). Shortly after differential clock signals CLK_OP and CLK_OM which will be described later are supplied in the case where the negative voltage generation circuit (6) starts the operation such as power-on at time t=t0, a charging capacitor Cc 6207 shown in FIG. 9 is not sufficiently charged. Consequently, a negative voltage value of −VDD is not immediately generated in NVG_OUT. However, each time the cycle of the high and low levels of CLK_OP and CLK_OM repeats, negative charges are accumulated in the charging capacitor Cc. Finally, sufficient negative charges are accumulated in the charging capacitor Cc and the value of −VDD, for example, −2.5 V is obtained.

To shorten the convergence time of the negative voltage output signal NVG_OUT, in the present invention, the frequency is increased at the timing of switching the switch ports of the high frequency antenna switch module. Specifically, the clock frequency of the clock signal CLK_OUT is increased only for predetermined time (=t1_B) since the timing when the switch-ports switching timing detection signal t_sw based on the control signal CNT for switching the switch ports at the timing of t=t1_1 in FIGS. 7A and 7B is detected. At the timing of t=t1_2 after lapse of t1_B from t1_1, the clock signal CLK_OUT is reset to the original clock frequency. As a matter of course, the predetermined time t1_B is set to be longer than convergence time t1_A of the negative voltage output signal NVG_OUT.

Figure 8:
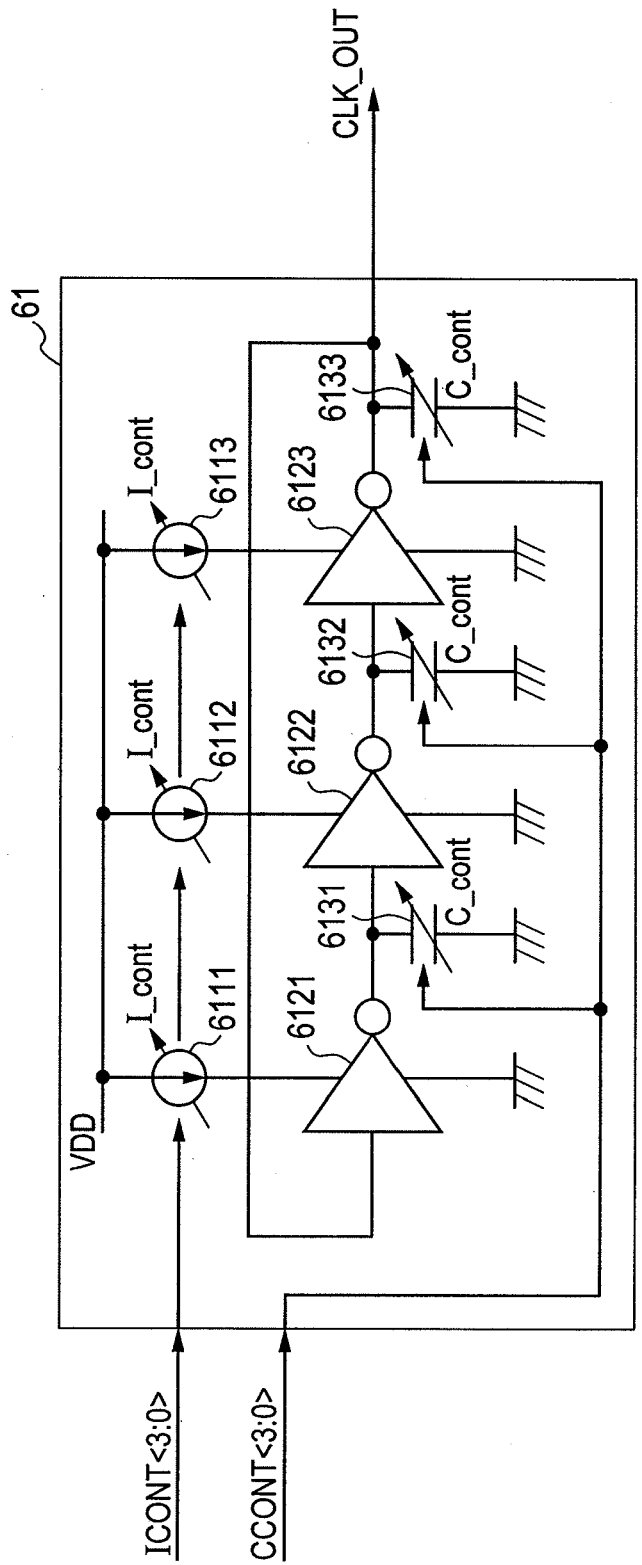
FIG. 8 is a diagram illustrating the configuration of a clock generation circuit included in the negative voltage generation circuit shown in FIG. 6.

FIG. 8 is a diagram illustrating the configuration of the clock generator (61) in the negative voltage generation circuit (6). The clock generator (61) includes three inverters 6121 to 6123, three variable bias current sources 6111 to 6113, and variable capacitors 6131 to 6133. To control terminals of the three variable bias current sources 6111 to 6113, the frequency control signal ICONT<3:0> is connected. To the three variable capacitors 6131 to 6133, the frequency control signal CCONT<3:0> is connected. The output terminal of the inverter 6123 is connected to the input terminal of the inverter 6121, the variable bias current source 6111 is connected to the power supply terminal of the inverter 6121, and the variable capacitor 6131 is connected to the output terminal of the inverter 6121. The output terminal of the inverter 6121 is connected to the input terminal of the inverter 6122, the variable bias current source 6112 is connected to the power supply terminal of the inverter 6122, and the variable capacitor 6132 is connected to the output terminal of the inverter 6122. The output terminal of the inverter 6122 is connected to the input terminal of the inverter 6123, the variable bias current source 6113 is connected to the power supply terminal of the inverter 6123, and the variable capacitor 6133 is connected to the output terminal of the inverter 6123. With the configuration, an oscillator capable controlling the clock frequency by the variable bias current sources 6111 to 6113 and the variable capacitors 6131 to 6133 can be realized. It is assumed that the clock generator 61 in the first embodiment has a configuration that the clock frequency increases when ICONT satisfies the relation of ICONT1>ICONT0 and CCONT satisfies the relation of CCONT1>CCONT0.

FIG. 9 is a diagram illustrating the configuration of the charge pump circuit (62) in the negative voltage generation circuit (6). The charge pump circuit (62) includes a clock buffer 621 and a charge pump core 620. The clock buffer (621) receives the clock signal CLK_OUT from the clock generator (61) and generates the differential clock signals CLK_OP and CLK_OM for driving the charge pump core (620). The charge pump core (620) includes two transmission capacitors Ct 6201 and 6202, a cross couple circuit made by two NMOS (negative channel Metal Oxide Semiconductor) field effect transistors MN 6205 and 6206 and two PMOS (positive channel Metal Oxide Semiconductor) field effect transistors MP 6203 and 6204, and a charging capacitor Cc 6207. Input terminals of the two transmission capacitors Ct 6201 and 6202 in the charge pump core (620) are connected to the clock buffer 621 and receive the differential clock signals CLK_OP and CLK_OM. The transmission capacitors Ct 6201 and 6202 are connected to the input terminals of the cross couple circuit. The MN 6206 and 6205 are connected to the charging capacitor Cc 6207.

In the charge pump core (620), when the differential clock signal CLK_OP is at the high level and the differential clock signal CLK_OM is at the low level, the MP 6203 and MN 6205 of the cross couple circuit are off, and MP 6204 and MN 6206 are on. At this time, the output terminal of the transmission capacitor Ct 6201 is connected to the ground GND side, so that VDD as a high-level signal of CLK_OP is applied to the transmission capacitor Ct 6201, and charges of Ctn·VDD expressed by the product of the capacitance value Ctn of the transmission capacitor Ct 6201 and the voltage value VDD are accumulated in the transmission capacitor Ct 6201.

Next, when the differential clock signal CLK_OP is at the low level and the differential clock signal CLK_OM is at the high level, the MP 6204 and MN 6206 of the cross couple circuit are off, and MP 6203 and MN 6205 are on. At this time, the output terminal of the transmission capacitor Ct 6201 is connected to the charging capacitor Cc side, so that the voltage at the input terminal of the transmission capacitor Ct 6201 becomes GND as the potential of CLK_OP. However, since the charges of Ctn·VDD are accumulated when CLK_OP is at the high level, negative voltage of −VDD is generated at the input terminal of the charging capacitor Cc 6207.

As illustrated in FIGS. 7A and 7B, when the negative voltage generation circuit (6) starts operation at t=t0, immediately after the differential clocks CLK_OP and CLK_OM are supplied, sufficient charges are not accumulated in the charging capacitor Cc 6207, so that the negative voltage value of −VDD is not immediately generated in NVG_OUT. However, each time the cycle of the high and low levels of CLK_OP and CLK_OM repeats, negative charges are accumulated in the charging capacitor Cc 6207. Finally, sufficient negative charges are accumulated in the charging capacitor Cc 6207 and the value of −VDD is obtained. To shorten the convergence time of the negative voltage output signal NVG_OUT, either increase in the value of the transmission capacitor Ct or increase in the clock frequency is necessary. However, increase in the value of the transmission capacitor Ct causes increase in area, and it is unpreferable. On the other hand, increase in the clock frequency causes increase in power consumption of the clock generator. In the embodiment, by increasing the frequency for the predetermined time since the switching timing of the switch ports of the high frequency antenna switch module, the convergence time of the negative voltage value can be shortened while suppressing the increase in power consumption to the minimum.

Figure 10:
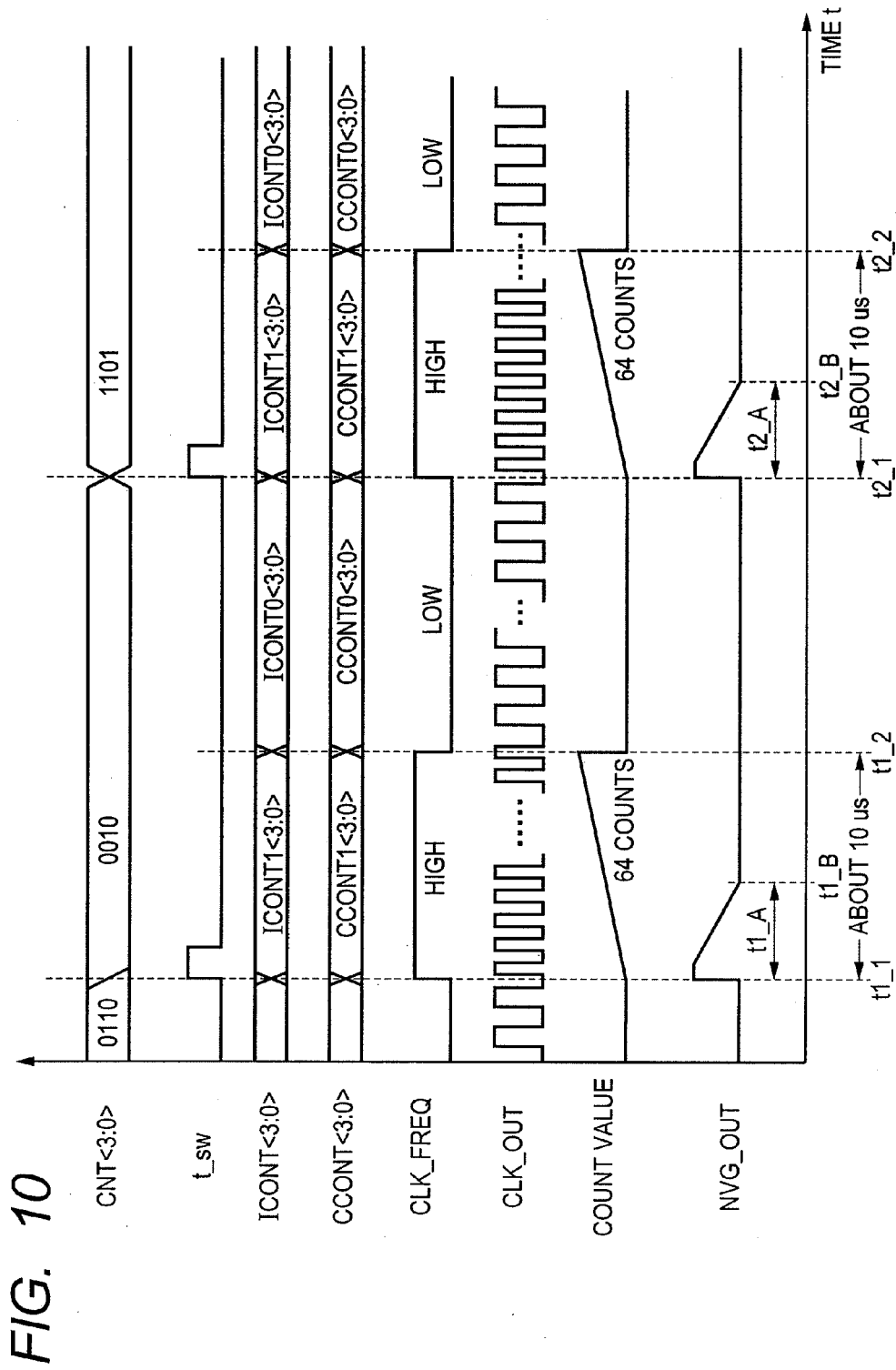
FIG. 10 is a timing chart showing the internal operation of a high frequency antenna switch module of ma the first embodiment of the present invention.

In a first mode of the high frequency antenna switch module of the embodiment, the module operates as shown in the timing chart of FIG. 10. The control signal CNT<3:0> which switches the switch ports at the timings of t=t1_1, t2_1, . . . is detected by the timing detector for switch-ports switching (4). Only for predetermined time (=t1_B, t2_B, . . . ) since the timing when the switch-ports switching timing detection signal t_sw is detected, the clock frequency of the clock signal CLK_OUT of the clock generator (61) is increased. The predetermined time (t1_B, t2_B, . . . ) is set to time longer than time (=t1_A, t2_A, . . . ) required to accumulate negative charges in the negative voltage generation circuit (6) and the value of −VDD is obtained. For example, only by about 10 μs from t=t1_1 and t=t2_1, the clock frequency is increased by twice or the like. As a result, without increasing the area of the semiconductor circuit, the convergence time of the negative voltage value can be shortened while suppressing the power consumption. The operation of the high frequency antenna switch module (1) will be described more specifically later.

Switch

Figure 11:
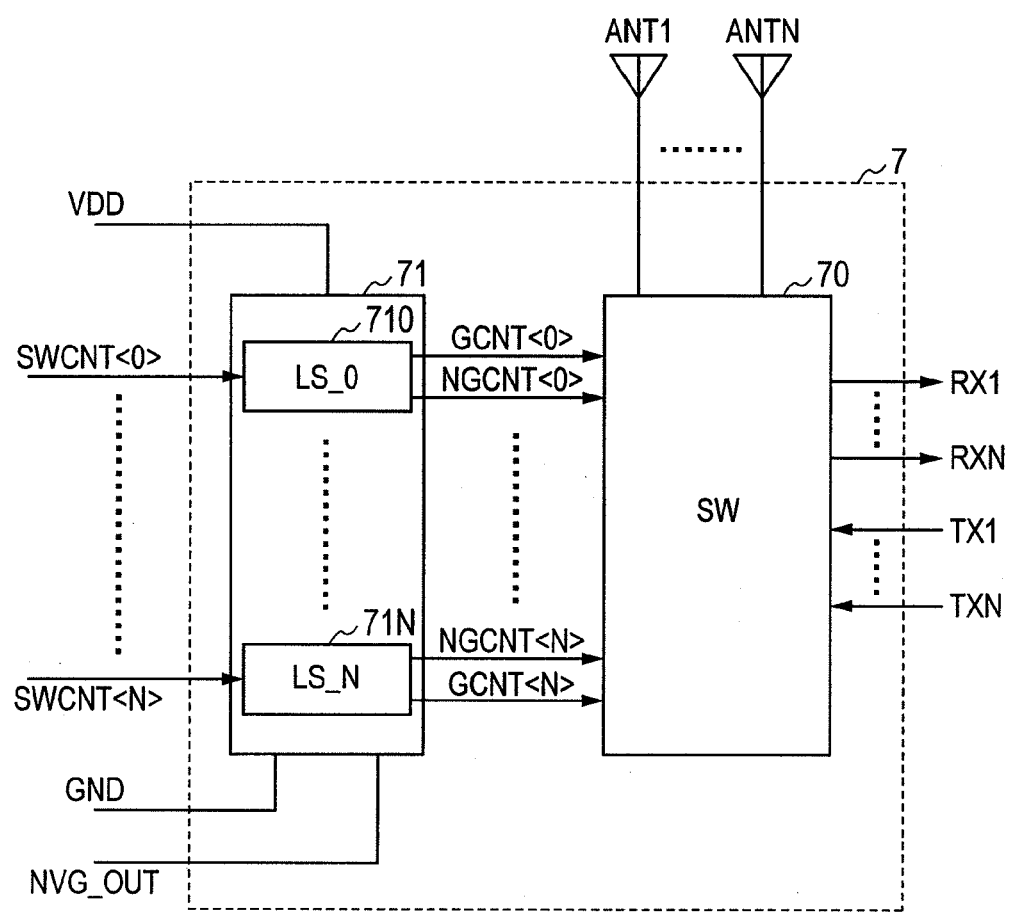
FIG. 11 is a diagram illustrating the configuration of a switch included in the high frequency antenna switch module shown in FIG. 1.

FIG. 11 is a diagram illustrating the configuration of the switch (7) for switch-ports switching in the high frequency antenna switch module (1) of the first embodiment of the invention shown in FIG. 1.

The switch (7) of FIG. 11 includes a level shifter (71) and a switch core (70). The level shifter (71) is constructed by level shifter units 710 to 71N of the same number as that of SW control signals of the decoder (3). Switch control signals SWCNT<0> to SWCNT<N> of the decoder (3) are connected to inputs of the level shifter units 710 to 71N in the level shifter (71), respectively, and the power supply voltages VDD and GND and the negative voltage output signal NVG_OUT are supplied to power-system terminals. The level shifter (71) is a circuit for converting the switch control signal SWCNT<N:0> to a voltage level adapted to control the switch core (70), that is the power supply voltage VDD and the negative voltage output signal NVG_OUT. To the inputs of the switch core (7), gate control signals GCNT<0> to GCNT<N> and NGCNT<0> to NGCNT<N> from the level shifter (71), RF ports (TX1 to RXN) for RF signals connected to the outside of the high frequency antenna switch module (1), and antennas ANT1 to ANTN are connected. The switch (7) has the role of receiving the input/output signals RX1 to TXN from N pieces of RF ports on the outside of the switch module and input/output signals from the antennas ANT1 to ANTN, performing on/off control on transistors in the switch core (70), and switching the RF ports and the switch ports of the antennas ANT by the gate control signals GCNT<0> to GCNT<N> and NGCNT<0> to NGCNT<N> from the level shifter (71).

Figure 32:
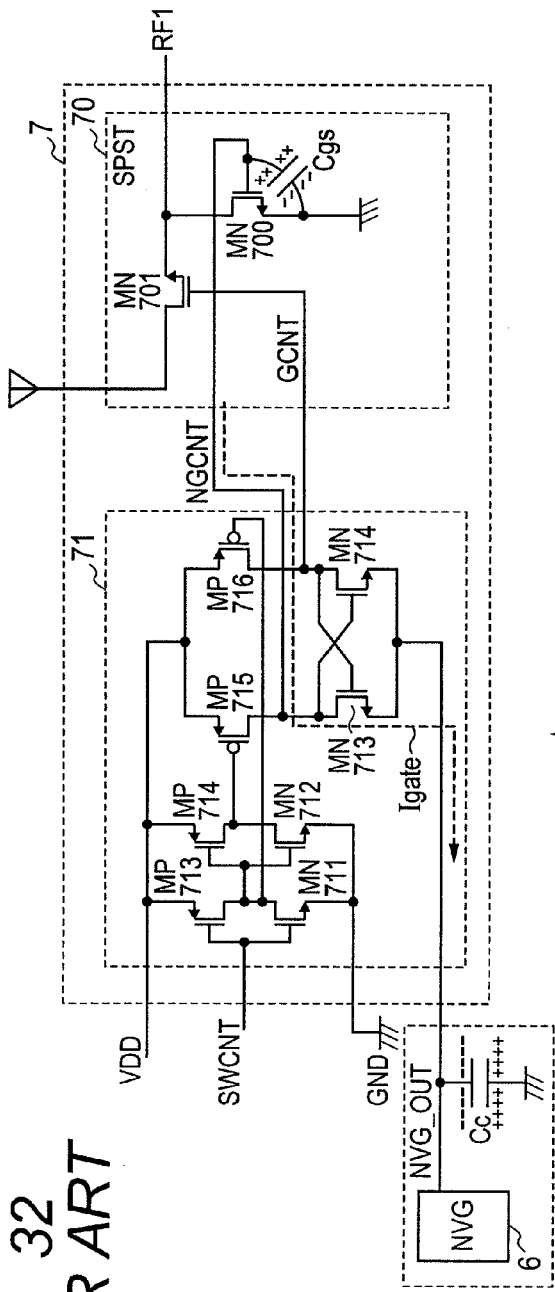
FIG. 32 is a diagram illustrating a detailed circuit configuration of a switch shown in FIG. 31.
Figure 33:
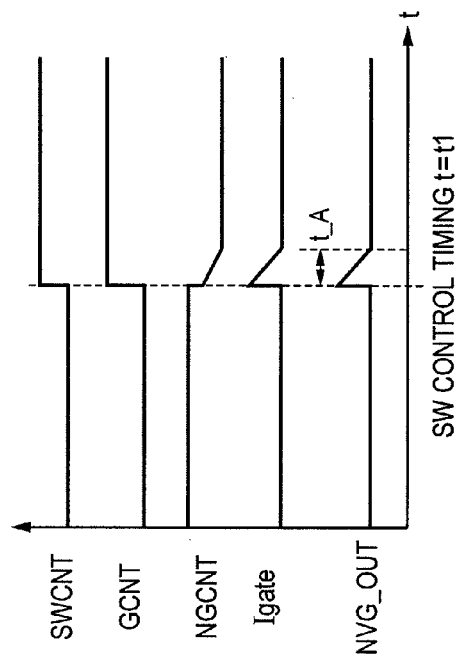
FIG. 33 is a diagram showing rise and re-conversion process of the negative voltage output signal NVG_OUT accompanying switch-ports switching of the switch illustrated in FIG. 32.

As the switch (7), the switch shown in FIG. 32 as a conventional one can be employed. In the circuit configuration of FIG. 32, the number of SW control signals is 1 for simplicity. Accordingly, the switch core (70) is an SPST switch. However, the present invention is not limited to the case where N=1. Since the detailed operation of the switch (7) of FIG. 32 is the same as that in the conventional technique, the description will not be repeated in the first embodiment.

Internal Operation of High Frequency Antenna Switch Module 1

FIG. 10 is a diagram showing waveforms of internal parts, to explain the internal operation of the high frequency antenna switch module 1 of the first embodiment of the present invention.

The uppermost waveform in FIG. 10 is of the output control signal CNT<3:0> of the I/O interface (2). At the timing when the control signal CNT<3:0> changes from "0110" to "0010" at the timing t=t1_1, the switch-ports switching timing detection signal t_sw of the second timing detector for switch-ports switching becomes the high level. On the other hand, since the control signal CNT changes from "0110" to "0010", the positive charges Cgs·VDD accumulated in a gate-source capacitor Cgs of a transistor in the switch core (70) flow in the charging capacitor Cc in the negative voltage generation circuit (6), and the negative voltage value of the negative voltage output signal NVG_OUT rises (close to 0 V)

to cancel the negative charges in Cc. However, at almost the same timing as the timing when the negative voltage value of NVG_OUT increases, as the frequency control signals ICONT<3:0> and CCONT<3:0>, ICONT1<3:0> and CCONT1<3:0> are output, and the clock frequency of the clock generator (61) in the negative voltage generation circuit (6) increases. By the operation, rise of the negative voltage output signal NVG_OUT can be promptly (t1_A) reset to the original negative voltage value. On the other hand, at the timing when t_sw becomes the high level, the 64 counter in the frequency control signal generator (5) starts counting the number of the output clocks CLK_OUT of the clock generator (61). At the timing when 64 clocks are counted, that is, at the timing of t=t1_2 in FIG. 10, the frequency control signals ICONT<3:0> and CCONT<3:0> are reset to ICONT0<3:0> and CCONT0<3:0> as the values before t=t_t1. After that, similar operations are repeated also when the control signal CNT changes at t=t2_1.

In the high frequency antenna switch module of the first embodiment of the invention described above, since the timing of switch-ports switching can be instantaneously detected synchronously with the actual switching timing, the clock frequency of the clock generator can be increased almost simultaneously with the actual timing of switch-ports switching in the switch. In addition, the period in which the clock frequency increases can be limited to predetermined time. Consequently, the voltage rise in the negative voltage output signal NVG_OUT accompanying switching of the switch ports of the switch can be promptly reset to the original negative voltage value without increasing the capacitance values of the charging capacitor Cc and the transmission capacitor Ct. As a result, the high frequency antenna switch module satisfying effects of shortening of time of the switch-ports switching, reduction in power consumption, and reduction of the area of the semiconductor chip can be realized.

Second Embodiment

Next, a high frequency antenna switch module according to a second embodiment of the present invention will be described with reference to the FIGS. 12 to 16.

Figure 12:
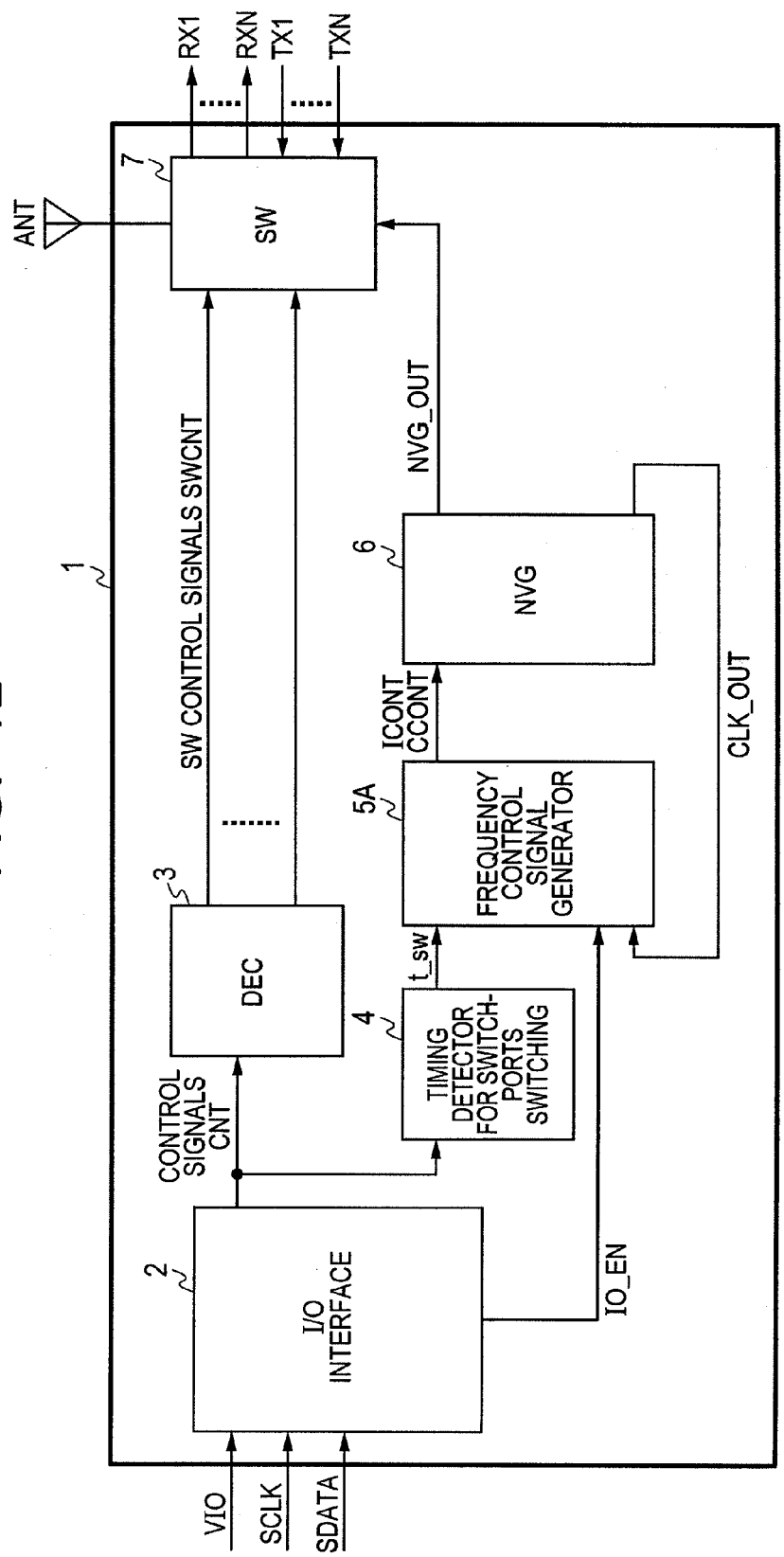
FIG. 12 illustrates the configuration of a high frequency antenna switch module of a second embodiment of the present invention.

FIG. 12 is a diagram illustrating the configuration of a high frequency antenna switch module (1) of the second embodiment of the present invention.

The high frequency antenna switch module (1) illustrated in FIG. 12 includes, in a manner similar to the first embodiment of the invention of FIG. 1, the I/O interface (2), the decoder (3), the timing detector for switch-ports switching (4), a frequency control signal generator (5A), the negative voltage generation circuit (6), and the switch (7).

The frequency control signal generator (5A) starts controlling the frequency control signals ICONT and CCONT at a timing when the I/O interface (2) becomes active, not at the timing when the timing detector for switch-ports switching (4) detects switching of the control signal CNT like in the first embodiment. The timing when the I/O interface (2) becomes active is naturally before the switching timing of the control signal CNT for the reason that the control signal CNT is updated after the I/O interface (2) becomes active and various commands are transmitted/received. Consequently, the timing signal IO_EN by which the I/O interface becomes active can be set as the timing of starting control on the frequency control signals ICONT and CCONT. At a timing much earlier than the switching of the control signal CNT, that is, at a timing before the switch port is switched, the frequency of the clock generator (61) can be increased in advance.

Figure 13:
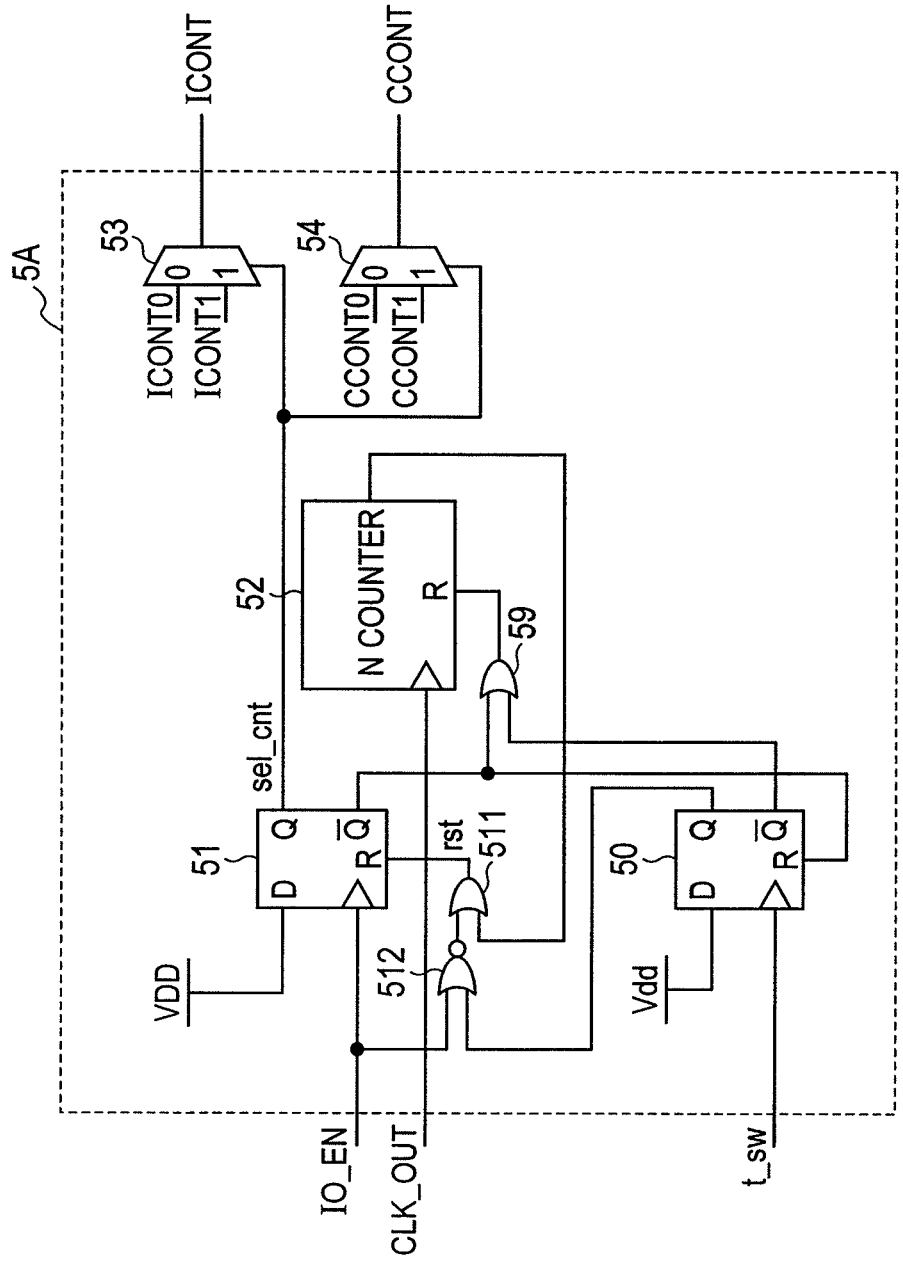
FIG. 13 is a diagram illustrating the configuration of a frequency control signal generator included in the high frequency antenna switch module shown in FIG. 12.

FIG. 13 illustrating the configuration of the frequency control signal generator (5A) in the switch module (1) in the second embodiment. The frequency control signal generator shown in FIG. 13 includes two DFFs 51 and 50, two 2-input selectors 53 and 54, an N counter 52, two 2-input OR circuits 59 and 511, and a 2-input negative OR circuit 512. To an input terminal D of the DFF 51, power supply voltage VDD is supplied. To a CLK input terminal of the DFF 51, an I/O active signal IO_EN generated from the I/O interface (2) is supplied. To a reset terminal R of the DFF 51, an output signal of the 2-input OR circuit 511 is supplied. To the input terminals of the 2-input selector (53), bias current adjustment values ICONT0 and ICONT1 as digital values of arbitrary number of bits are supplied. To the input terminals of the other 2-input selector 54, load capacitance adjustment values CCONT0 and CCONT1 are supplied as digital values of arbitrary number of bits. Each of the two 2-input selectors has a selector terminal for selecting one of the digital values connected to the two input terminals as an output. To the selector terminal, sel_cnt as an output of the DFF 51 is supplied. To the input terminal of the N counter 52, a clock signal CLK_OUT generated from the clock generator (61) in the negative voltage generation circuit (6) and an output of the 2-input OR circuit 59 are connected. To the input terminal D of the DFF 50, the power supply voltage VDD is supplied. To a clock terminal, the switch-ports switching timing detection signal t_sw is supplied. To a reset terminal R, the inversion signal of sel_cnt output from the DFF 51 is supplied. To the input terminal of the negative OR circuit 512, the timing signal IO_EN as the I/O active signal and an output of the DFF 50 are connected. To the input terminal of the OR circuit 511, an output of the negative OR circuit 512 and an output of the N counter are connected. To the input terminal of the OR circuit 59, the inversion signal of the output signal selcnt of the DFF 51 and the inversion signal of the output of the DFF 50 are supplied.

Figure 14:
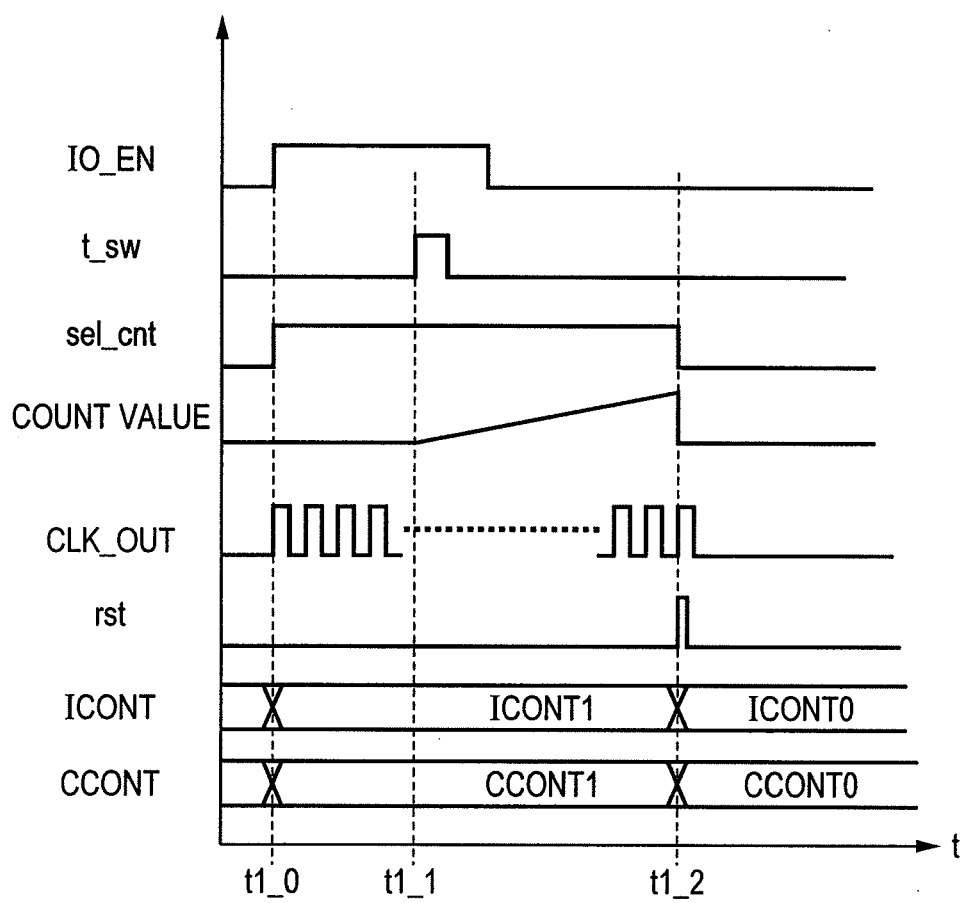
FIG. 14 is a timing chart for explaining the internal operation of the frequency control signal generator illustrated in FIG. 13.

FIG. 14 is a timing chart for explaining the internal operation of the frequency control signal generator (5A) illustrated in FIG. 13. When the I/O interface (2) becomes active and IO_EN becomes the high level at t=t1_0 as a trigger, the output sel_cnt of the DFF 51 changes from the low level to the high level. In response to the switch from the low level to the high level of sel_cnt, the outputs ICONT and CCONT of the selectors (53) and (54) switch from ICONT0 and CCONT0 to ICONT1 and CCONT1, respectively. After that, in response to the switch of the control signal CNT and the switch to the high level of the switch-ports switching timing detection signal t_sw at the timing t=t1_1, reset of the N counter 52 is cancelled, and counting of the rising edge of the clock signal CLK_OUT from the clock generator (61) is started. In the case where the count value N of the N counter is 64, when the N counter counts 64 clock edges, that is, at the time of t=t1_2, the output signal rst of the N counter changes from the low level to the high level. Accompanying the switch from the low level to the high level of the output signal rst, sel_cnt as an output signal of the DFF 51 changes again from the high level to the low level, and the outputs ICONT and CCONT of the selectors 53 and 54 become ICON0 and CCONT0, respectively. Since the inversion signal of sel_cnt, that is, a high-level signal is supplied to the reset terminal of the N counter and the DFF 50, the count value in the N counter is initialized and a standby state is set. If the control signal CNT is not switched, that is, if the switch ports are not switched after the I/O interface (1) becomes active, the DFF 51 is reset at the timing when the timing signal IO_EN as the I/O active signal changes from the high level to the low level. More specifically, in the case where the control signal CNT is not switched, at the timing when IO_EN changes from the high level to the low level when t_sw is at the low level, the output of the negative OR circuit 512 becomes the high level.

Accordingly, the OR circuit 511 also becomes the high level, so that the DFF 51 is reset, sel_cnt becomes the low level, the outputs ICONT and CCONT of the selectors 53 and 54 become ICONT0 and CCONT0, respectively, and the frequency of the clock generator (61) is also reset to the frequency before t=t1_0. Although the clock signal CLK_OUT before t=t1_and after t=t1_2 has low frequency waves, the waves are not shown (also in FIGS. 21, 25 and so on).

Since the components other than the frequency control signal generator (5A) in the high frequency antenna switch module (1) of the second embodiment have configurations and operation principles similar to those of the first embodiment, the description will not be repeated in the second embodiment.

Internal Operation of High Frequency Antenna Switch Module 1

Figure 15:
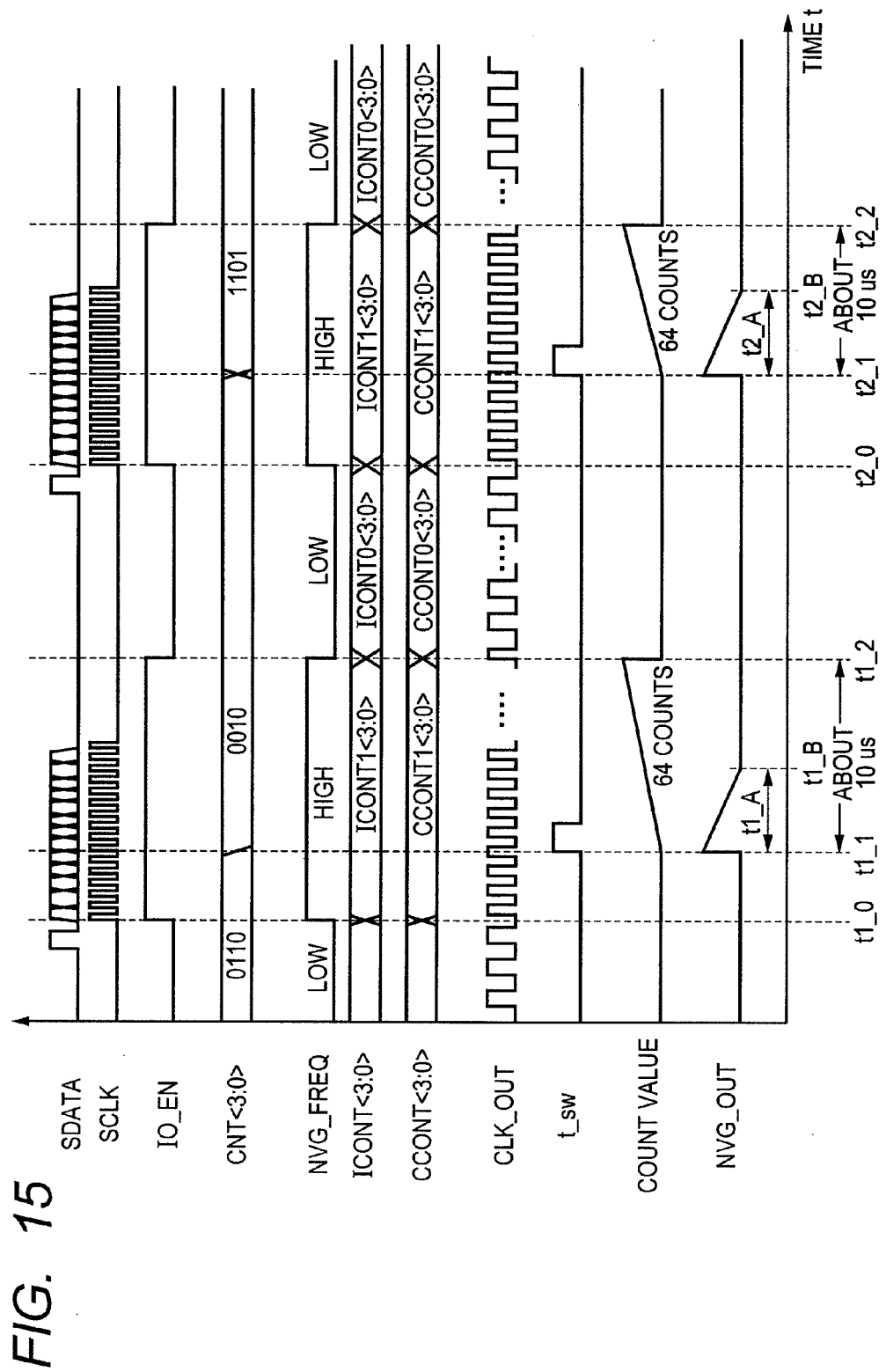
FIG. 15 is a timing chart illustrating the internal operation of the high frequency antenna switch module of the second embodiment of the present invention.

FIG. 15 is a diagram showing waveforms of internal parts, to explain the internal operation of the high frequency antenna switch module (1) of the second embodiment of the invention.

The first and second waveforms in FIG. 15 are of the control signal SDATA from the outside of the high frequency antenna switch module (1) and the system clock SCLK. A control command is detected from SDATA and SCLK and, at the timing of t=t1_0, the timing signal IO_EN as the I/O active signal becomes the high level. At the timing of t=t1_0, the frequency control signals ICONT<3:0> and CCONT<3:0> are output as ICONT1<3:0> and CCONT1<3:0>, respectively, and the clock signal of the clock generator (61) in the negative voltage generation circuit (6) increases. After that, at the timing when the control signal CNT as the output control signal CNT of the I/O interface (2) changes from "0110" to "0010" at the timing t=t11, the switch-ports switching timing detection signal t_sw of the timing detector for switch-ports switching becomes the high level. On the other hand, since the control signal CNT changes from "0110" to "0010", the positive charges Cgs·VDD accumulated in a gate-source capacitor Cgs of a transistor for the switch-ports switching in the switch core (70) flow in the charging capacitor Cc in the negative voltage generation circuit (6), and the negative voltage value of the negative voltage output signal NVG_OUT rises (close to 0 V) to cancel the negative charges in Cc. However, as described above, before the negative voltage value of NVG_OUT increases, the clock frequency of the clock generator (61) increases. Consequently, rise of the negative voltage output signal NVG_OUT can be reset to the original negative voltage value more quickly (t1_A, t2_A, -) than the first embodiment. On the other hand, at the timing when t_sw becomes the high level, the 64 counter in the frequency control signal generator (5A) starts counting the number of the clock signals CLK_OUT of the clock generator (61). At the timing when 64 clocks are counted, that is, at the timing of t=t1_2 in FIG. 15, the frequency control signals ICONT<3:0> and CCONT<3:0> are reset to ICONT0<3:0> and CCONT0<3:0> as the values before t=t1_0. After that, similar operations are repeated also when the control signal CNT changes at t=t2_1.

In the high frequency antenna switch module (1) of the second embodiment of the invention described above, the clock frequency of the clock generator (61) can be increased much earlier than the switch-ports switching timing of the switch, and the period in which the clock frequency increases can be limited to predetermined time. Consequently, the voltage rise in the negative voltage output signal NVG_OUT accompanying switching of the switch ports of the switch (7) can be promptly reset to the original negative voltage value without increasing the capacitance values of the charging capacitor Cc and the transmission capacitor Ct. As a result, the high frequency antenna switch module satisfying effects of shortening of the switch-ports switching time, reduction in power consumption, and reduction of the area of the semiconductor chip more than the first embodiment can be realized.

Third Embodiment

Next, a high frequency antenna switch module according to a third embodiment of the present invention will be described with reference to the FIGS. 16 to 22.

Figure 16:
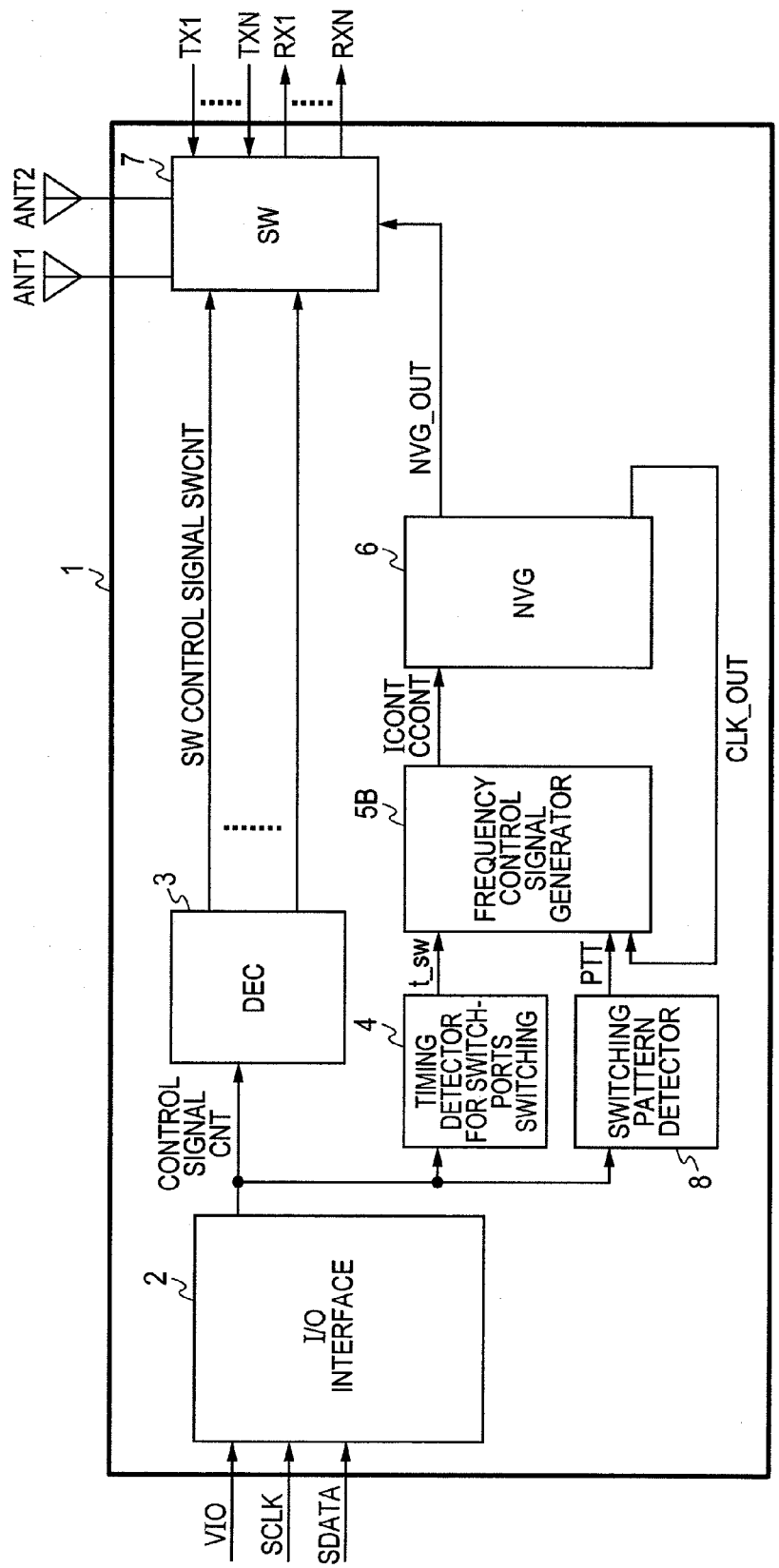
FIG. 16 illustrates the configuration of a high frequency antenna switch module of a third embodiment of the present invention.

FIG. 16 is a diagram illustrating the configuration of a high frequency antenna switch module (1) of the third embodiment of the present invention.

The high frequency antenna switch module (1) illustrated in FIG. 16 includes the I/O interface (2), the decoder (3), the timing detector for switch-ports switching (4), a frequency control signal generator (5B), the negative voltage generation circuit (6), the switch (7), and a switching pattern detector (8).

The switching pattern detector (8) receives a switching signal CNT from the I/O interface (2), as shown in a flowchart to be described later, detects the switching pattern of the switching signal CNT, and generates a pattern detection signal PTT.

By including the switching pattern detector (8), the high frequency antenna switch module of the third embodiment switches the increase amount of the clock frequency of the clock generator in accordance with the number of switch ports at the time of switching a presently selected switch port to another switch port. As described in the background art, a present portable terminal has multiple bands and multiple modes and the number of ports of the high frequency antenna switch module (1) is increasing. Consequently, various switching patterns of the switch ports exist, and the number of transistors which are turned on/off in the switch (7) varies according to combination of the patterns, so that the rise value of the negative voltage output signal NVG_OUT changes according to the switching patterns.

Figure 17:
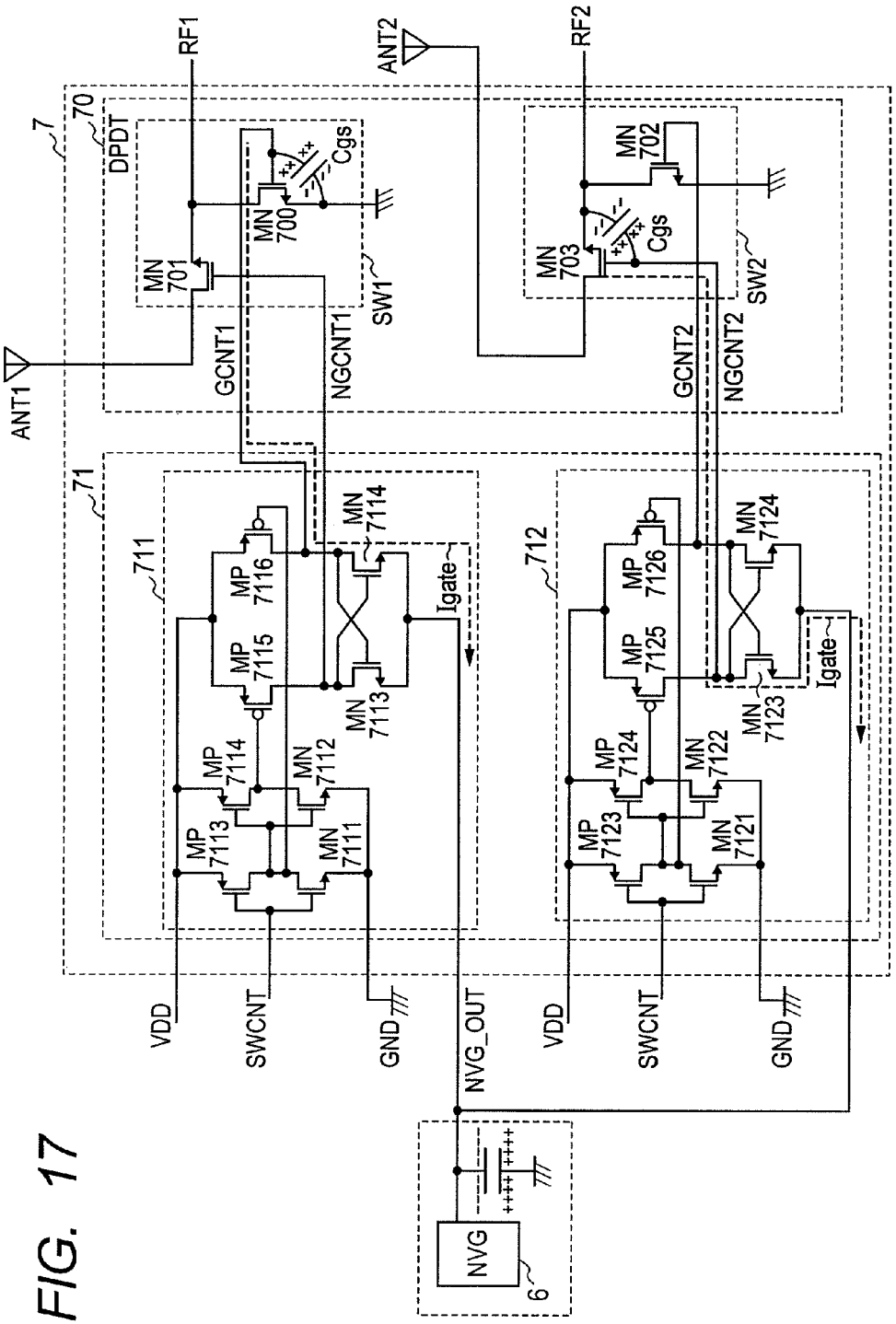
FIG. 17 is a diagram illustrating a detailed circuit configuration of a case where there are two or more antennas in the high frequency antenna switch module.

For example, the switch (7) in FIG. 17 is made of two SPST switches and has two antennas. The level shifter (71) is constructed by a first level shifter (711) and a second level shifter (712). A concrete configuration example of the level shifters is the same as that of the level shifter (71) shown in FIG. 32, and its description will not be repeated.

ANT1 as one of the two antennas is an antenna of the 800 MHz band, and ANT2 is an antenna of the 1900 MHz band. At a timing when a transistor MN 703 in a switch SW2 on the side of the antenna ANT2 of the 1900 MHz band is turned off from the on state and the transistor MN 702 is turned on from the off state, and when there is not switching among the switch ports on the switch SW1 on the side of the antenna ANT1 of the 800 MHz, positive charges accumulated in the gate-source capacitor Cgs in the MN 703 flow in the charging capacitor Cc in the negative voltage generation circuit (6) via a transistor 7123, so that the negative voltage value of the negative voltage output signal NVG_OUT rises.

Figure 18:
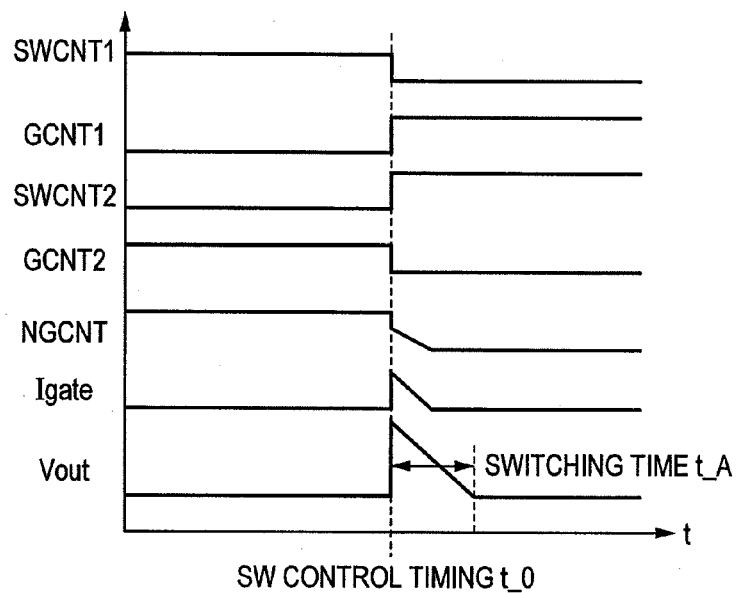
FIG. 18 is a diagram showing rise and re-conversion process of the negative voltage output signal NVG_OUT accompanying switch-ports switching of the switch illustrated in FIG. 17.

Next, the case shown in FIGS. 17 and 18 will be described. Where, the transistor MN 703 on the side of the ANT 2 of the 1900 MHz band is turned off from the on state, the transistor MN 702 is turned on from the off state, a transistor MN 700 on the side of the ANT 1 of the 800 MHz is turned off from the on state, and a transistor MN 701 is turned on from the off state. That is, at the timing when communication in the 1900 MHz band is stopped and communication in the 800 MHz band is started, the positive charges accumulated in the gate-source capacitor Cgs in the transistor MN 703 flow into the charging capacitor Cc in the negative voltage generation circuit (6) via the transistor MN 7123 and positive charges accumulated in the gate-source capacitor Cgs in the transistor MN 700 also flow into the charging capacitor Cc at the same timing via a transistor MN 7114. As a result, the negative voltage value of NVG_OUT increases by about twice as compared with the case of switching only the switch ports in the 1900 MHz band, so that time (switching time t_A) required for the negative voltage value is reset to the original negative voltage value also increases.

Also in such a phenomenon, in the high frequency antenna switch module (1) of the third embodiment, since the switching pattern detector (8) is provided, the negative voltage value which rises is predicted and can be reset promptly.

Figure 19:
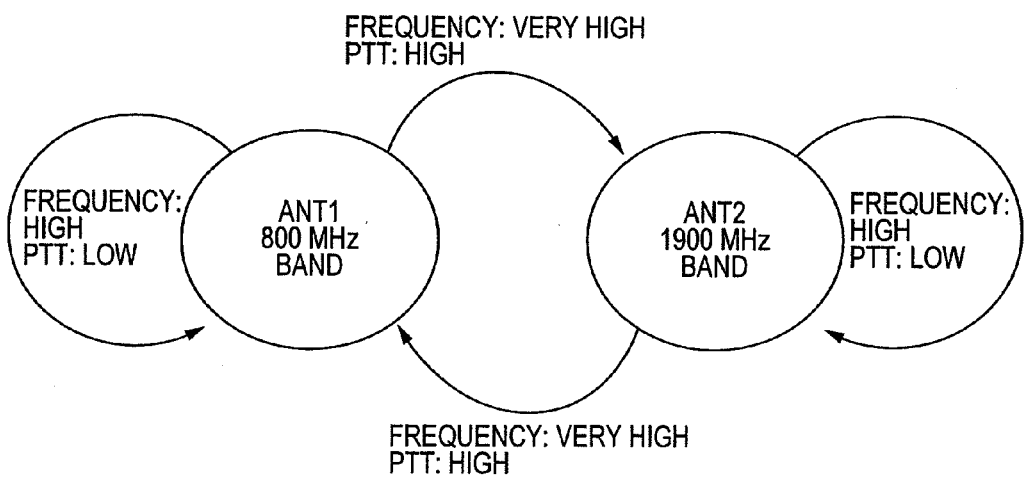
FIG. 19 is a flowchart of a switch-ports switching pattern detector included in the high frequency antenna switch module illustrated in FIG. 16.

FIG. 19 shows an example of a flowchart of the switching pattern detector (8). For example, in a state where a switch port is on the side of the ANT 1, that is, the 800 MHz band is selected at present, when the next switching is again switching in the 800 MHz band, the pattern detection signal PTT is set to the low level. In a state where a switch port is on the side of the ANT 2, that is, the 1,900 MHz band is selected at present, when the next switching is again switching in the 1,900 MHz band, the pattern detection signal PTT is set to the low level. Finally, in the case where the next switching accompanies switching between bands such as switching from the 800 MHz band to the 1,900 MHz band or from the 1,900 MHz band to the 800 MHz band, the pattern detection signal PTT becomes the high level. In the case where the switching pattern detection signal PTT becomes the high level as described above, by making the increase amount of the clock frequency of the clock generator (61) larger than that in the case where the signal PTT is detected as the low level, the speed of the resetting of the negative voltage value of the negative voltage output signal NVG_OUT can be increased. From another viewpoint, in the case where switch-ports switching between bands is not accompanied, it is unnecessary to excessively increase the increase amount of the clock frequency of the clock generator (61), so that increase in the power consumption accompanying the increase in frequency can be further suppressed.

Although only switching between bands has been described in the third embodiment, the basic idea of the third embodiment is not limited to the above but can be also applied to, for example, the diversity method of simultaneously transmitting/receiving plural RF signals, the MIMO (Multiple Input Multiple Output) method, and the like, and the time of the switch-ports switching can be shortened and the power consumption can be further reduced.

Figure 20:
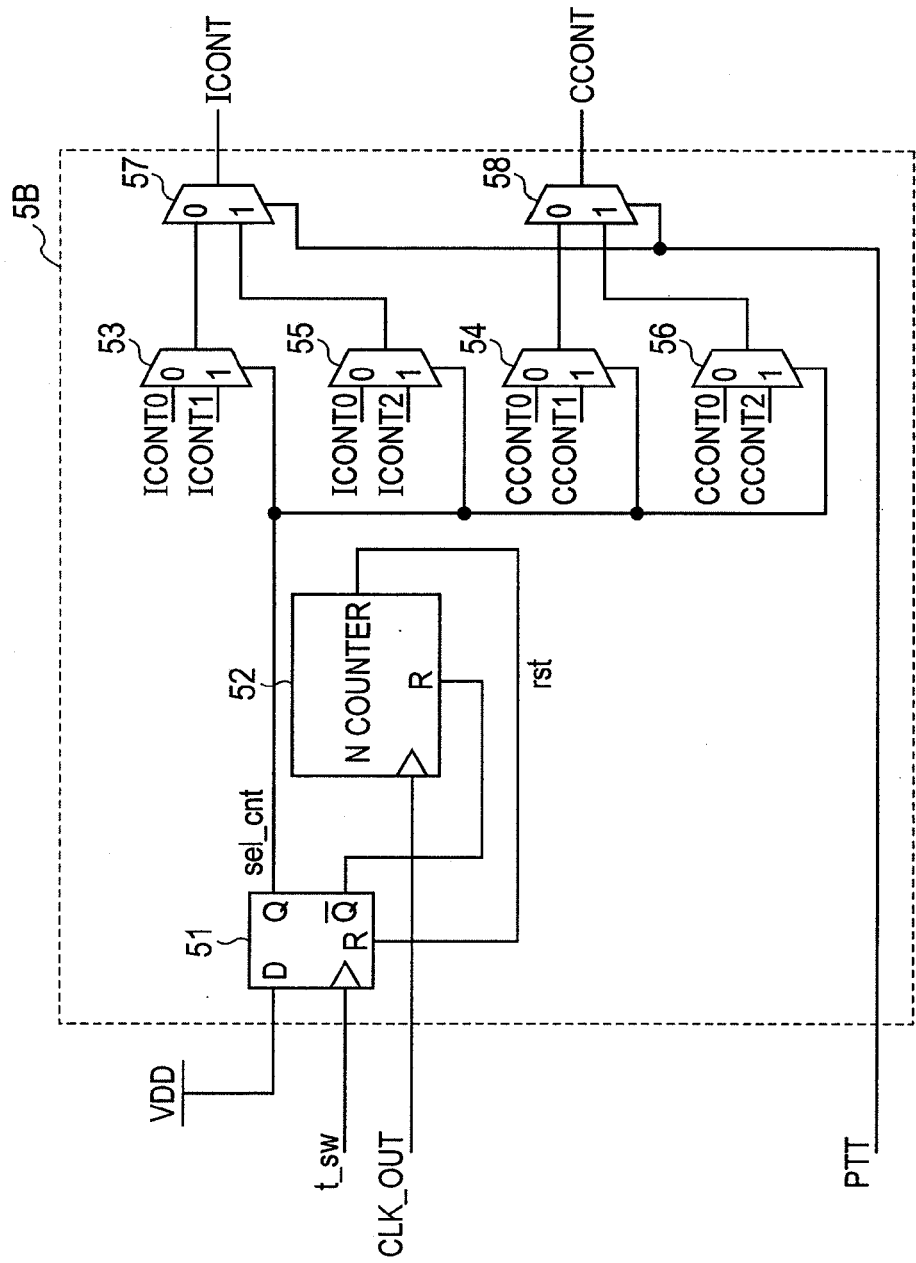
FIG. 20 is a diagram illustrating the configuration of a frequency control signal generator included in the high frequency antenna switch module shown in FIG. 16.

FIG. 20 illustrates the configuration of the frequency control signal generator (5B) in the switch module (1) in the third embodiment. The frequency control signal generator shown in FIG. 20 includes a DFF (51), six 2-input selectors 53 to 58, and an N counter 52. To an input terminal D of the DFF 51, power supply voltage VDD is supplied. To a CLK input terminal of the DFF 51, the switch-ports switching timing detection signal t_sw is supplied. To a reset terminal R of the DFF 51, an output of the N counter 52 is supplied. To the input terminals of the first 2-input selector 53, bias current adjustment values ICONT0 and ICONT1 are supplied, as digital values of arbitrary number of bits. To the input terminals of the second 2-input selector 54, load capacitance adjustment values CCONT0 and CCONT1 are supplied, as digital values of arbitrary number of bits. To the input terminals of the third 2-input selector 55, bias current adjustment values ICONT0 and ICONT2 are supplied. To the input terminals of the fourth 2-input selector 56, load capacitance adjustment values CCONT0 and CCONT2 are supplied. Each of the 2-input selectors 53 to 56 has a selector terminal for selecting one of the digital values connected to the two input terminals as an output. To the selector terminal, sel_cnt as an output of the DFF 51 is supplied. To the input terminals of the 2-input selector 57, an output of the first selector 53 and an output terminal of the third selector 55 are connected. To the input terminals of the final 2-input selector 58, an output of the second selector 54 and an output of the fourth selector 56 are connected. Each of the 2-input selectors 57 and 58 has a selector terminal for selecting one of the digital values connected to the two input terminals, and the switching pattern detection signal PTT is supplied to the selector terminal.

Figure 21:
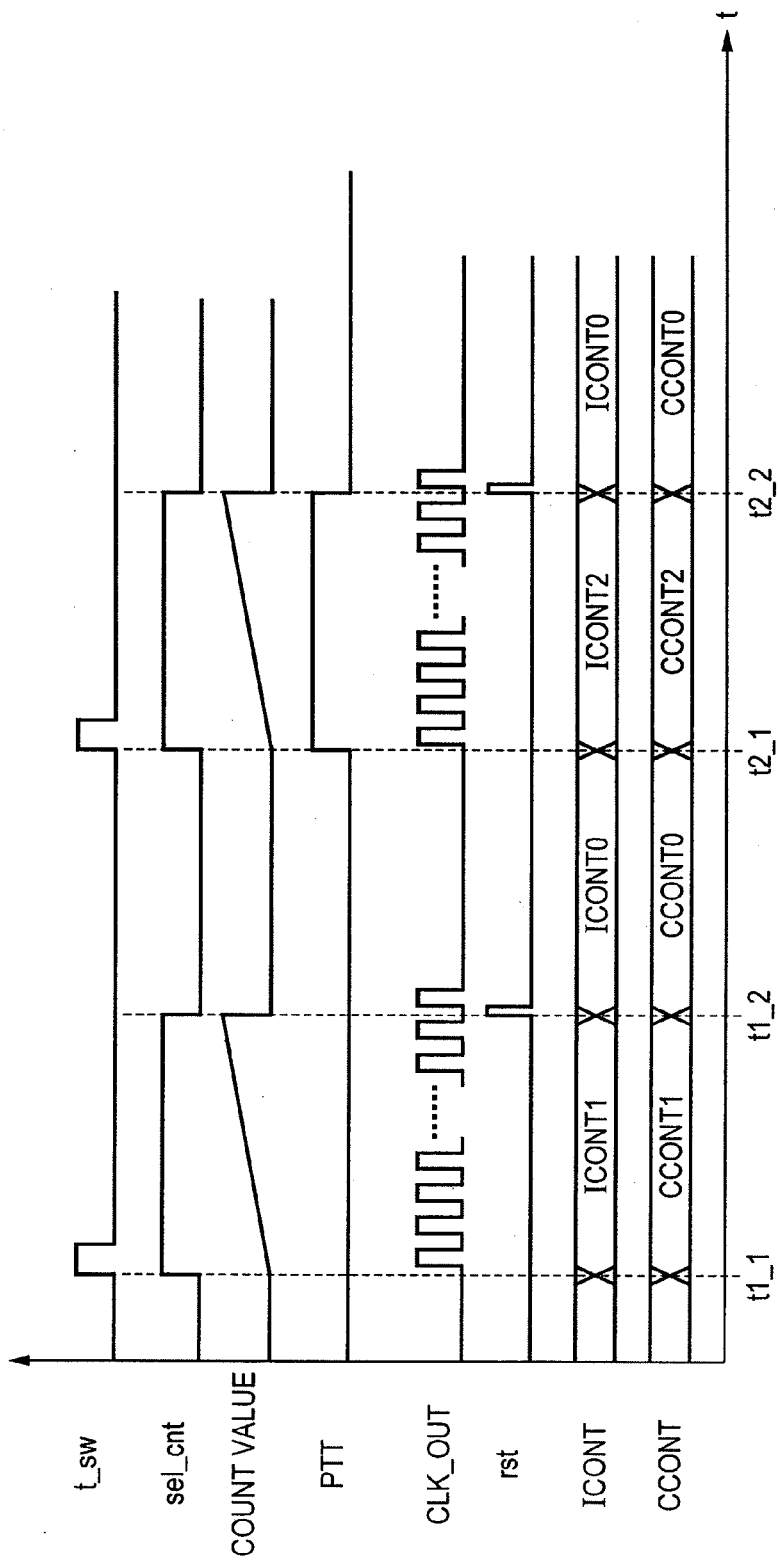
FIG. 21 is a timing chart for explaining the internal operation of the frequency control signal generator illustrated in FIG. 20.

FIG. 21 is a timing chart for explaining the internal operation of the frequency control signal generator (5B) illustrated in FIG. 20. Using the switch-ports switching timing detection signal t_sw from the timing detector for switch-ports switching at t=t1_1 as a trigger, the output sel_cnt of the DFF 51 changes from the low level to the high level. In response to the switch from the low level to the high level of sel_cnt, the outputs of the selectors 53 and 56 switch from ICONT0 and CCONT0 to ICONT1 and CCONT1, respectively. On the other hand, at the timing of t=t2_1, the switching pattern detector (8) detects the switching of the band of the switch (7) from 1,900 MHz to 800 MHz and sets the switching pattern detection signal PTT to the high level. As a result, ICONT2 and CCONT2 are output as the output signals ICONT and CCONT of the selectors 57 and 58. On the other hand, in response to the switch from the low level to the high level of sel_cnt, reset of the N counter 52 is cancelled, and counting of the rising edge of the clock signal from the clock generator (61) is started. In the case where the count value N of the N counter is 64, when the N counter counts 64 clock edges, that is, at the timing of t=t1_2 and t=t2_2, the output signal rst of the N counter changes from the low level to the high level. Accompanying the switch from the low level to the high level of the output signal rst, sel_cnt as an output signal of the DFF 51 changes again from the high level to the low level, and the outputs of the selectors 53 and 55 become ICON0 and the outputs of the selectors 54 and 56 become CCONT0. As a result, the outputs ICONT and CCONT of the selectors 57 and 58 also become ICONT0 and CCONT0, respectively, and the inversion signal of sel_cnt, that is, a high-level signal is supplied to the reset terminal of the N counter, so that the count value in the N counter is initialized and a standby state is set.

When the clock frequency in the case where ICONT1 and CCONT1 are supplied to the clock generator (61) is 5 MHz, the time required for the N counter to count 64 clock edges is 12 μs. Similarly, when the clock frequency in the case where ICONT2 and CCONT2 are supplied to the clock generator (61) is 8 MHz, the time required for the N counter to count 64 clock edges is 8 μs. It is therefore understood that the frequency control signal generator (5B) can output the control signals ICONT1 or ICONT2, CCONT1 or CCONT2 which increases the frequency of the clock generator (61) only for the time of 12 μs or 8 μs.

The relations of the clock frequencies corresponding to the frequency control signals ICONT and CCONT satisfy the relation of ICONT2>ICONT1>ICONT0 and the relation of CCONT2>CCONT1>CCONT0.

Since the configurations and operation principles of components other than the frequency control signal generator (5B) and the switching pattern detector (8) constructing the high frequency antenna switch module (1) of the third embodiment are similar to those of the first and second embodiments, their description will not be repeated in the third embodiment.

Internal Operation of High Frequency Antenna Switch Module

Figure 22:
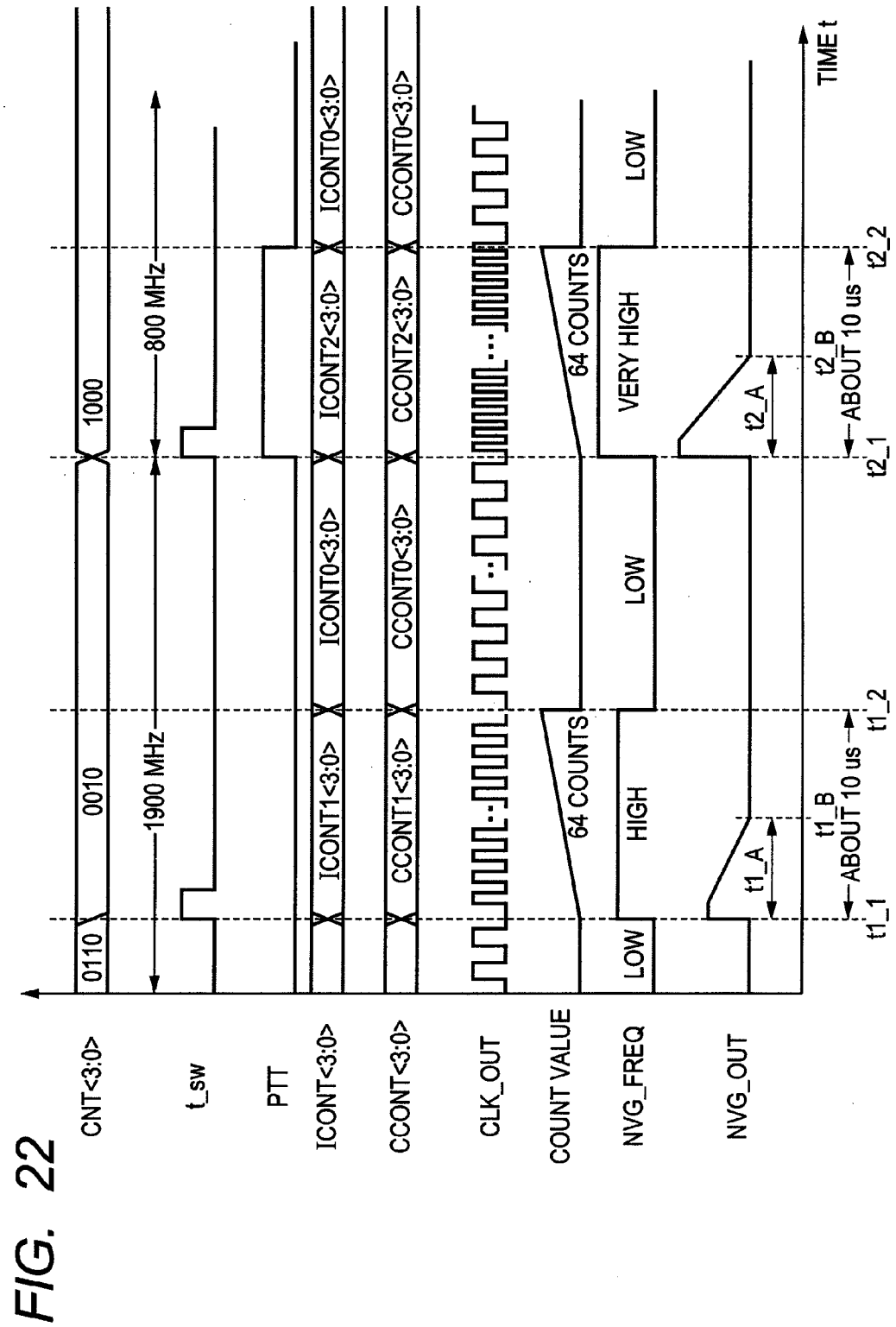
FIG. 22 is a timing chart illustrating the internal operation of the high frequency antenna switch module of the third embodiment of the invention.

FIG. 22 is a diagram showing waveforms of internal parts, to explain the internal operation of the high frequency antenna switch module 1 of the third embodiment of the present invention.

The uppermost waveform in FIG. 22 is of the output control signal CNT of the I/O interface (2). At the timing when the control signal CNT changes from "0010" to "1000" at the timing t=t2_1, the switch-ports switching timing detection signal t_sw of the second timing detector for switch-ports switching becomes the high level. At the same timing, the switching pattern detector (8) detects the switching of the band of the switch (7) from 1,900 MHz to 800 MHz and sets the detection signal PTT to the high level.

On the other hand, since the control signal CNT changes from "0010" to "1000", the positive charges Cgs·VDD accumulated in a gate-source capacitor Cgs in a transistor for switching the switch ports in the switch core (70) flow in the charging capacitor Cc in the negative voltage generation circuit (6) to cancel the negative charges in Cc, and the negative voltage value of the negative voltage output signal rises (close to 0 V). Further, since the switching between the frequency bands (from 1,900 MHz to 800 MHz) accompanies, the rise amount of the negative voltage value increases as compared with the case of switching of switch-ports in the same band. However, at almost the same timing as the timing when the negative voltage value of NVG_OUT increases, as the frequency control signals ICONT<3:0> and CCONT<3:0>, ICONT2<3:0> and CCONT2<3:0> are output, and the clock frequency of the clock generator (61) in the negative voltage generation circuit (6) increases. In this case, the clock frequency increases more than the case of switching between the bands. Specifically, although NVG_frequency of the output clock of the clock generator (61) changes from the low level to the high level at the time of switching between bands, in this case, it changes from the low level to the very high level. For example, since the clock frequency is 8 MHz according to this example, required the time for the N counter to count 64 clock edges between t=t2_1 to t=t2_2 is 8 μs. By the operation, also in the case where the switch ports are switched between the bands, rise of the negative voltage output signal NVG_OUT can be promptly reset to the original negative voltage value. On the other hand, at the timing when t_sw becomes the high level, the 64 counter in the frequency control signal generator (5B) starts counting the number of the clock signals CLK_OUT of the clock generator (61). At the timing when 64 clocks are counted, that is, at the timing of t=t1_2 in FIG. 22, the frequency control signals ICONT<3:0> and CCONT<3:0> are reset to ICONT0<3:0> and CCONT0<3:0> as the values before t=t2_1. In addition, the NVG_frequency of the output clock of the clock generator (61) is also reset to the low frequency.

In the high frequency antenna switch module (1) of the third embodiment of the invention described above, by detecting the switching pattern of the switch (7), the negative voltage value of the negative voltage output signal NVG_OUT is increased. In the case where the switching pattern detection signal PTT becomes the high level, by making the increase amount of the clock frequency of the clock generator (61) larger than that in the case where the signal PTT is detected as the low level, the speed of resetting of the negative voltage value of the negative voltage output signal NVG_OUT accompanying the switch-ports switching can be increased. From another viewpoint, when the switching of the switch ports between the bands is unaccompanied, it is unnecessary to excessively increase the increase amount of the clock frequency of the clock generator (61). Therefore, increase in power consumption accompanying increase in the frequency can be further suppressed. Although only switching between bands has been described, the basic idea of the third embodiment is not limited to the above. Also in the diversity method of simultaneously transmitting/receiving plural RF signals, the MIMO (Multiple Input Multiple Output) method, and the like, the switch-ports switching time of the switch can be shortened and the power consumption can be further reduced.

Fourth Embodiment

Next, a high frequency antenna switch module according to a fourth embodiment of the present invention will be described with reference to the FIGS. 23 to 25.

Figure 23:
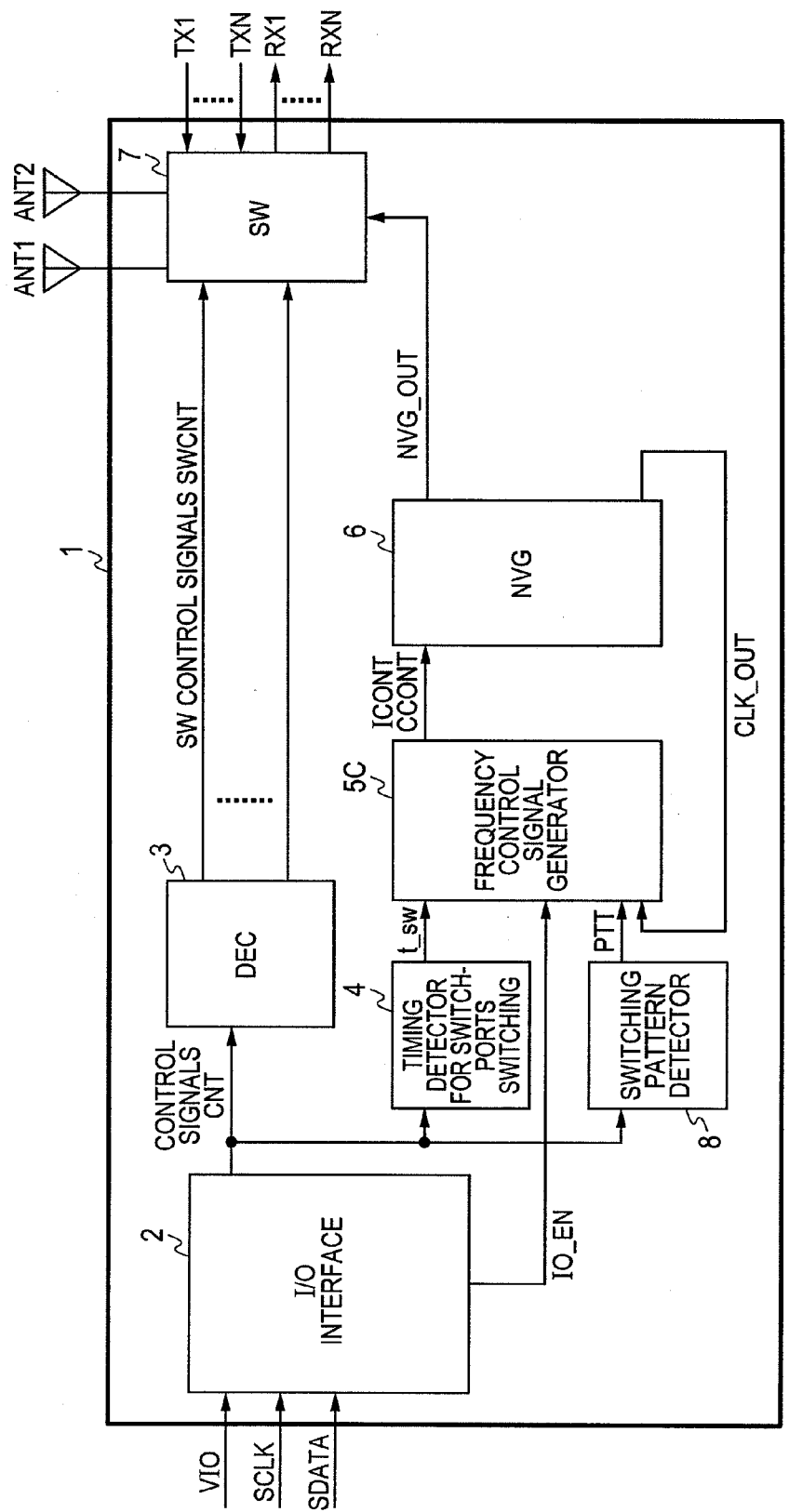
FIG. 23 illustrates the configuration of a high frequency antenna switch module of a fourth embodiment of the present invention.

FIG. 23 is a diagram illustrating the configuration of a high frequency antenna switch module (1) of the fourth embodiment of the present invention.

The high frequency antenna switch module (1) includes, in a manner similar to the third embodiment, the I/O interface (2), the decoder (3), the timing detector for switch-ports switching (4), a frequency control signal generator (5C), the negative voltage generation circuit (6), the switch (7), and the switching pattern detector (8).

In the embodiment of the invention, in a manner similar to the second embodiment, the frequency control signal generator (5C) starts controlling the frequency control signals ICONT and CCONT at a timing when the I/O interface (2) becomes active, not at the timing when the timing detector for switch-ports switching detects switching of the control signal CNT like in the first embodiment. The high frequency antenna switch module (1) of the fourth embodiment has both of the characteristic of the high frequency antenna switch module (1) of the second embodiment and that of the high frequency antenna switch module (1) of the third embodiment.

Figure 24:
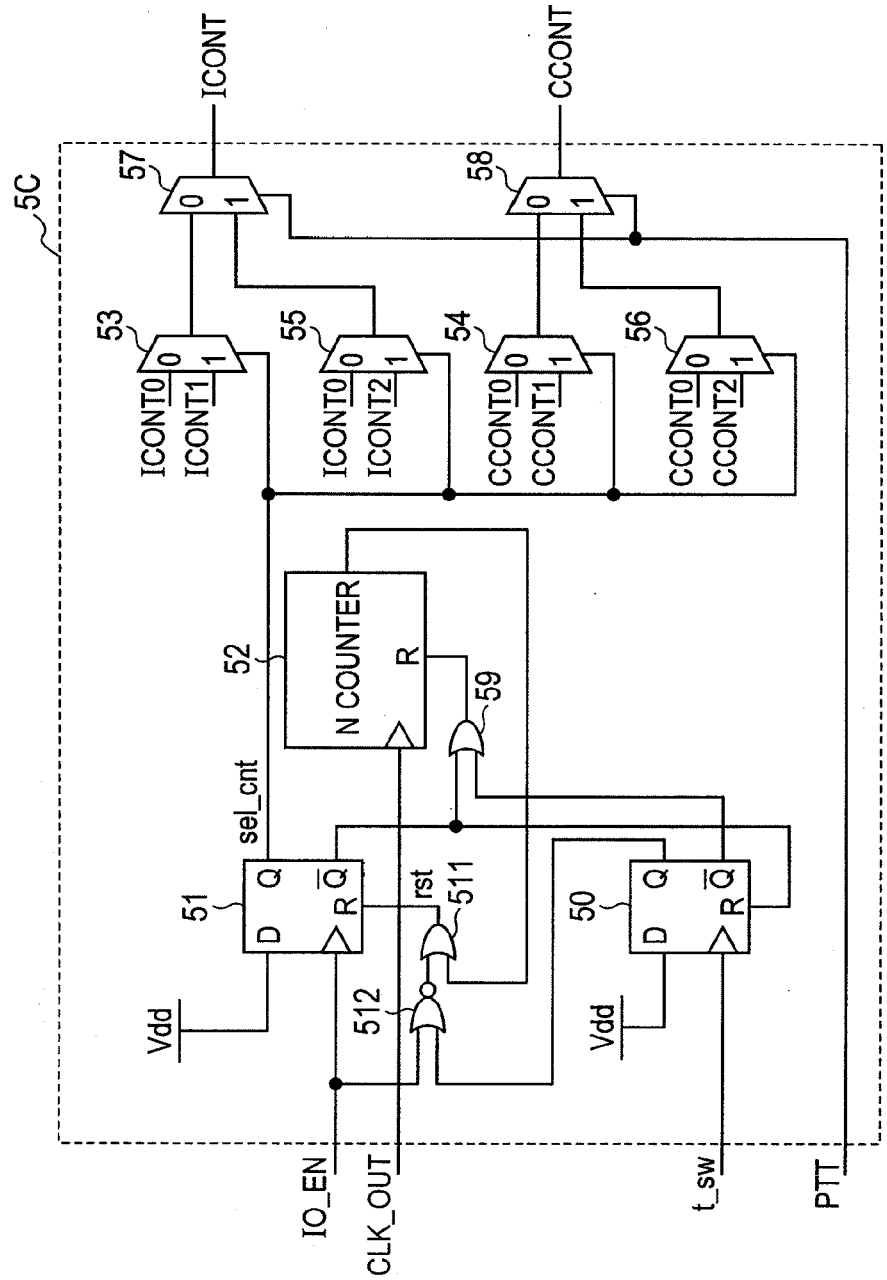
FIG. 24 is a diagram illustrating the configuration of a frequency control signal generator included in the high frequency antenna switch module shown in FIG. 23.

FIG. 24 illustrating the configuration of the frequency control signal generator (5C) in the switch module (1) in the fourth embodiment. The frequency control signal generator includes two DFFs 51 and 50, six 2-input selectors 53 to 58, and an N counter 52, two 2-input OR circuits 59 and 511, and a 2-input negative OR circuit 512. To an input terminal D of the DFF 51, power supply voltage VDD is supplied. To a CLK input terminal of the DFF 51, an I/O active signal IO_EN generated from the I/O interface (2) is supplied. To a reset terminal R of the DFF 51, an output signal of the 2-input OR circuit 511 is supplied. To the input terminals of the first 2-input selector 53, bias current adjustment values ICONT0 and ICONT1 are supplied, as digital values of arbitrary number of bits. To the input terminals of the second 2-input selector 54, load capacitance adjustment values CCONT0 and CCONT1 are supplied, as digital values of arbitrary number of bits. To the input terminals of the third 2-input selector 55, bias current adjustment values ICONT0 and ICONT2 are connected. To input terminals of the fourth 2-input selector 56, the load capacitance adjustment values CCONT0 and CCONT2 are connected. Each of the 2-input selectors 53 to 56 has a selector terminal for outputting one of the digital values connected to the two input terminals. To the selector terminal, sel_cnt as an output of the DFF 51 is supplied. To the input terminal of the 2-input selector 57, an output of the first selector 53 and the output terminal of the third selector 55 are coupled. To the input terminal of the final 2-input selector 58, an output of the second selector 54 and an output of the fourth selector 56 are connected. Each of the 2-input selectors 57 and 58 has a selector terminal for outputting one of the digital values connected to the two input terminals. The switching pattern detection signal PTT is connected to the selector terminal. A clock signal CLK_OUT generated from the clock generator (61) in the negative voltage generation circuit (6) is connected to the input terminal of the N counter 52. An output of the 2-input OR circuit 59 is connected to the reset terminal of the N counter 52. To the input terminal D of the DFF 50, the power supply voltage VDD is supplied. To a clock terminal, the switch-ports switching timing detection signal t_sw is supplied. To a reset terminal, the inversion signal of sel_cnt output from the DFF 51 is supplied. To the input terminal of the negative OR circuit 512, the I/O active signal IO_EN and an output of the DFF 50 are connected. To the input terminal of the OR circuit 511, an output of the negative OR circuit 512 and an output of the N counter are connected. To the input terminal of the OR circuit 59, the inversion signal of the output signal sel_cnt of the DFF 51 and the inversion signal of the output of the DFF 50 are supplied.

Figure 25:
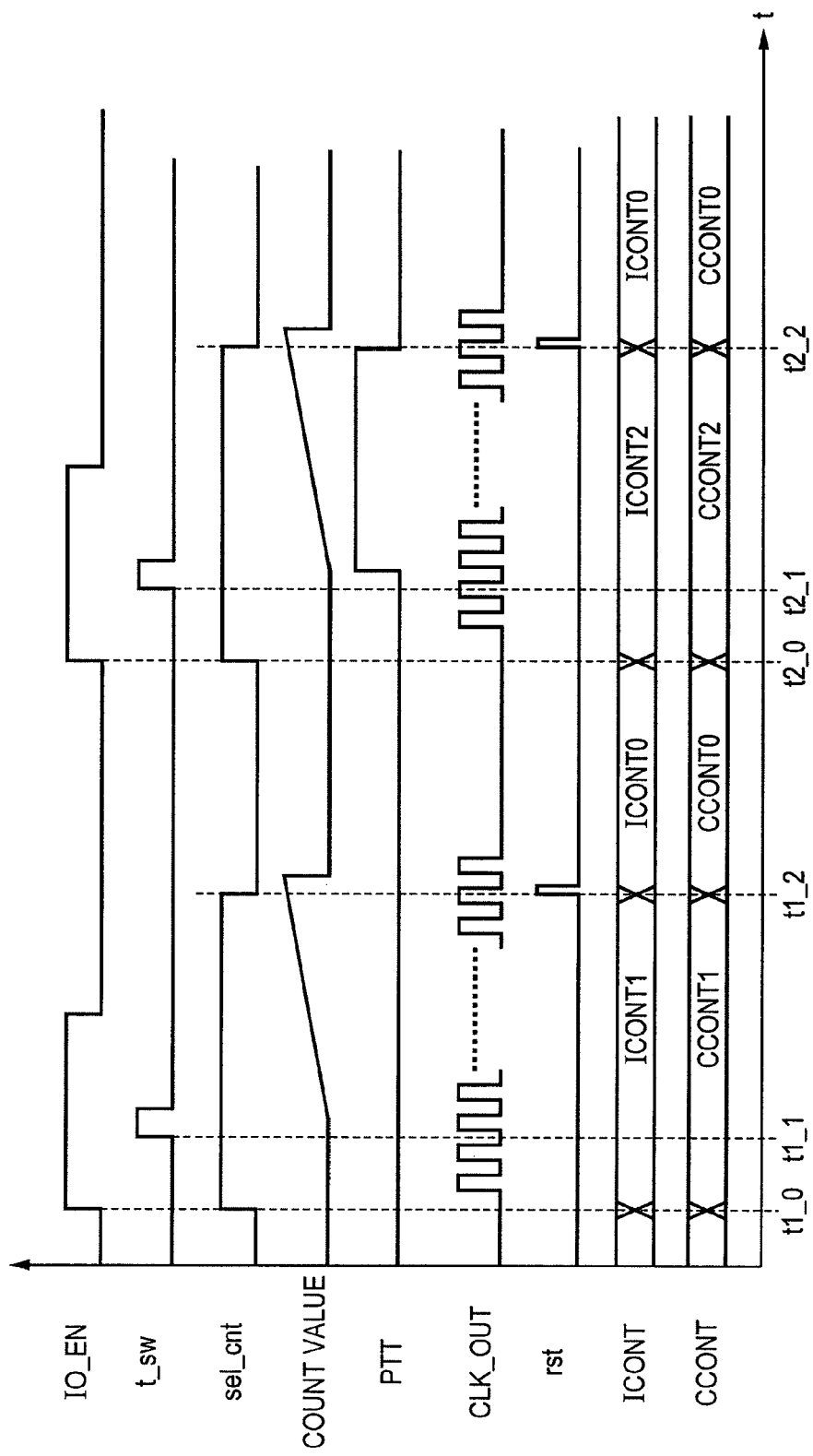
FIG. 25 is a timing chart for explaining the internal operation of the frequency control signal generator illustrated in FIG. 24.

FIG. 25 is a timing chart for explaining the internal operation of the frequency control signal generator (5C) illustrated in FIG. 24. When the I/O interface becomes active and IO_EN becomes the high level at t=t2_0 as a trigger, the output sel_cnt of the DFF 51 changes from the low level to the high level. In response to the switch from the low level to the high level of sel_cnt, the outputs of the selectors 53 to 56 switch from ICONT0 and CCONT0 to ICONT0 to ICONT1 and CCONT1 respectively. On the other hand, the switching pattern detection circuit (8) detects the switch of the band from 1,900 MHz to 800 MHz of the switch (7) at the timing of t=t2_1 and sets the detection signal PTT to the high level. Consequently, ICONT2 and CCONT2 are output as the output signals ICONT and CCONT of the selectors 57 and 58, respectively. At the same timing t=t2_1, the control signal CNT is switched. As the switch-ports switching timing detection signal t_sw becomes the high level, reset of the N counter 52 is cancelled, and counting of the rising edge of the clock signal from the clock generator (61) is started. In the case where the count value N of the N counter is 64, when the N counter counts 64 clock edges, that is, at the time of t=t2_2, the output signal rst of the N counter changes from the low level to the high level. Accompanying the switch from the low level to the high level of the output signal rst, sel_cnt as an output signal of the DFF 51 changes again from the high level to the low level, and the outputs ICONT and CCONT of the selectors 57 and 58 become ICONT0 and CCONT0, respectively. Since the inversion signal of sel_cnt, that is, a high-level signal is supplied to the reset terminal of the N counter and the DFF 50, the count value in the N counter is initialized and a standby state is set. If the control signal CNT is not switched, that is, if the switch ports are not switched after the I/O interface becomes active, the DFF 51 is reset at the timing when the I/O active signal IO_EN changes from the high level to the low level. More specifically, in the case where the control signal CNT is not switched, at the timing when IO_EN changes from the high level to the low level when t_sw is at the low level, the output of the negative OR circuit 512 becomes the high level. Accordingly, the OR circuit 511 also becomes the high level, so that the DFF 51 is reset, sel_cnt becomes the low level, the outputs ICONT and CCONT of the selectors 53 and 54 become ICONT0 and CCONT0, respectively, and the frequency of the clock generator (61) is also reset to the frequency before t=t2_0.

Since the components other than the frequency control signal generator (5C) in the high frequency antenna switch module (1) of the fourth embodiment have configurations and operation principles similar to those of the first, second, and third embodiments, the description will not be repeated in the fourth embodiment. Since the timing chart of the high frequency antenna switch module (1) is combination of the second and third embodiments, it will not be described.

In the high frequency antenna switch module (1) of the fourth embodiment of the invention described above, the clock frequency of the clock generator (61) can be increased much earlier than the switching timing of the switch. In addition, by detecting the switching pattern of the switch (7), rise in the negative voltage value of the negative voltage output signal NVG_OUT can be corresponded. Consequently, in the case where the switching pattern detection signal PTT becomes the high level, by increasing the increase amount of the clock frequency of the clock generator (61) more than the case where the signal PTT is detected as the low level, the speed of resetting of the negative voltage value of the negative voltage output signal NVG_OUT accompanying the switch-ports switching can be increased. From another viewpoint, in the case where switching of switch ports between bands is not accompanied, it is unnecessary to excessively increase the increase amount of the clock frequency of the clock generator (61), so that increase in the power consumption accompanying the increase in frequency can be further suppressed. Although only switching between bands has been described, the basic idea of the fourth embodiment is not limited to the above. For example, in the diversity method of simultaneously transmitting/receiving plural RF signals, the MIMO (Multiple Input Multiple Output) method, and the like, the switching time of the switch can be shortened and the power consumption can be further reduced.

Fifth Embodiment

Figure 26:
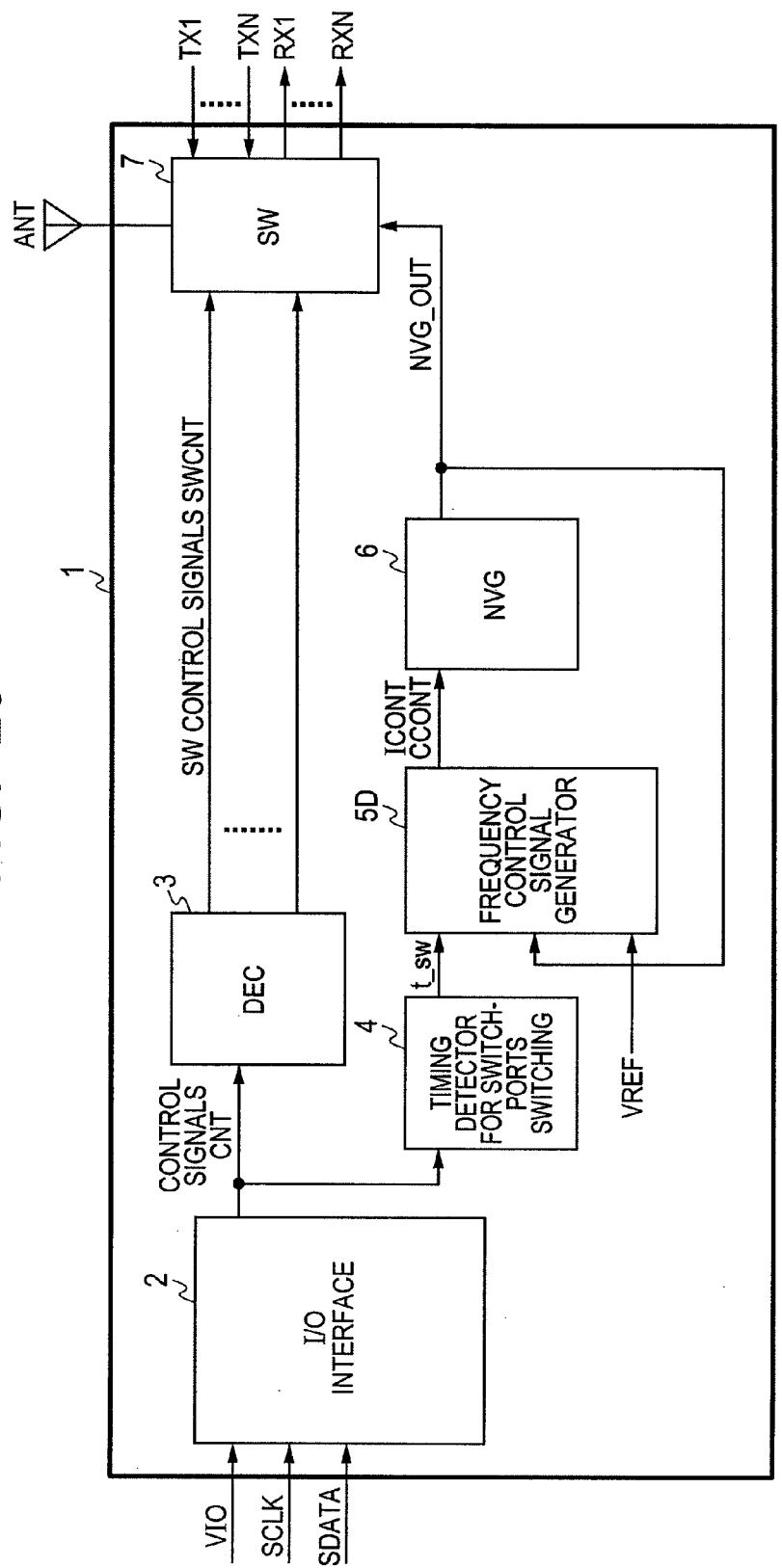
FIG. 26 illustrates the configuration of a high frequency antenna switch module of a fifth embodiment of the present invention.

A high frequency antenna switch module according to a fifth embodiment of the present invention will now be described. FIG. 26 is a diagram illustrating the configuration of a high frequency antenna switch module (1) of the fifth embodiment of the present invention.

The high frequency antenna switch module (1) illustrated in FIG. 26 is a modification of the first embodiment of the invention shown in FIG. 1 and, in a manner similar to the first embodiment, includes an I/O interface (2), a decoder (3), a timing detector for switch-ports switching (4), a frequency control signal generator (5D), a negative voltage generation circuit (6), and a switch (7).

The frequency control signal generator (5D) receives the switch-port switching timing detection signal t_sw from the timing detector for switch-ports switching (4), the negative voltage output signal NVG_OUT from the negative voltage generation circuit 6, and the reference voltage VREF and generates frequency control signals ICONT and CCONT for controlling the clock frequency of the clock generator (61) in the negative voltage generation circuit (6).

In a manner similar to the first embodiment, in the frequency control signal generator (5D), the timing of starting the control on the frequency control signals ICONT and CCONT is set to the timing when the timing detector for switch-ports switching detects switching of the control signal CNT. However, the timing of finishing the control is a timing when the negative voltage output value of the negative voltage output signal NVG_OUT reach the predetermined voltage VREF. That is, as soon as the negative voltage value reach a specified value, the clock frequency of the clock generator (61) can be reset to the original frequency before the increase. Therefore, increase in the power consumption can be minimized.

Since the components other than the frequency control signal generator (5D) in the high frequency antenna switch module (1) of the fifth embodiment have configurations and operation principles similar to those of the first embodiment, the description will not be repeated in the fifth embodiment.

Internal Operation of High Frequency Antenna Switch Module 1

Figure 27:
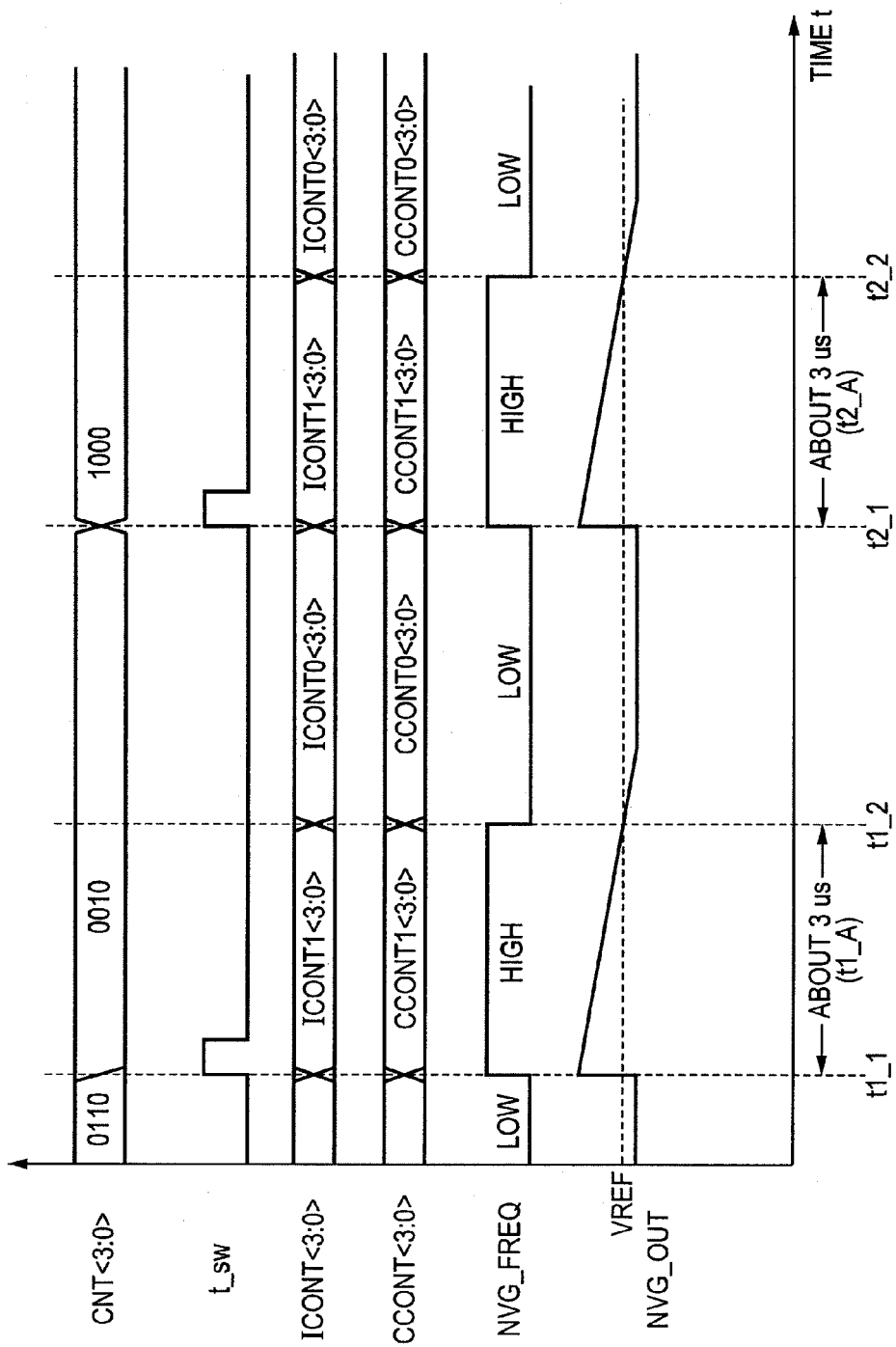
FIG. 27 is a timing chart illustrating the internal operation of the high frequency antenna switch module of the fifth embodiment of the invention.

FIG. 27 is a diagram showing waveforms of internal parts, to explain the internal operation of the high frequency antenna switch module 1 of the fifth embodiment of the invention described with reference to FIG. 26. The uppermost waveform in FIG. 27 is of the output control signal CNT of the I/O interface (2). At the timing when the control signal CNT changes from "0110" to "0010" at the timing t=t1_1, the switch-ports switching timing detection signal t_sw of the second timing detector for switch-ports switching becomes the high level. On the other hand, since the control signal CNT changes from "0110" to "0010", the positive charges Cgs·VDD accumulated in a gate-source capacitor Cgs of a transistor for switching the switch ports in the switch core (70) flow in the charging capacitor Cc in the negative voltage generation circuit (6), and the negative charges in Cc are cancelled. Consequently, the negative voltage value of the negative voltage output signal NVG_OUT rises (close to 0 V). However, at almost the same timing as the timing when the negative voltage value of NVG_OUT increases, as the frequency control signals ICONT<3:0> and CCONT<3:0>, ICONT1<3:0> and CCONT1<3:0> are output, and the clock frequency of the clock generator (61) in the negative voltage generation circuit (6) increases. By the operation, rise of the negative voltage output signal NVG_OUT can be promptly reset to the original negative voltage value. On the other hand, at the timing t1_2 when sufficient negative charges are accumulated in the charging capacitor Cc and the negative voltage value reach a reference voltage VREF (for example, after 3 μs from t1_1, that is, switching time t1_A), the frequency control signals ICONT<3:0> and CCONT<3:0> are reset to ICONT0<3:0> and CCONT0<3:0> as the values before t=t_t1. After that, similar operations are repeated also when the control signal CNT changes at t=t2_1.

It is understood from the above that desired operation is realized that the timing of starting control on the frequency control signals ICONT and CCONT is, in a manner similar to the first embodiment, a timing when the timing detector for switch-ports switching detects switching of the control signal CNT, and the timing of finishing the control is the timing when the negative voltage output value of the negative voltage output signal NVG_OUT reach the predetermined voltage VREF.

In the high frequency antenna switch module (1) of the fifth embodiment of the invention described above, as soon as the negative voltage value reach a specified value, the clock frequency of the clock generator (61) can be reset to the original frequency before the increase. Consequently, the high frequency antenna switch module satisfying effects of shortening of time of minimizing increase in power consumption and reduction of the area of the semiconductor chip can be realized.

Sixth Embodiment

Figure 28:
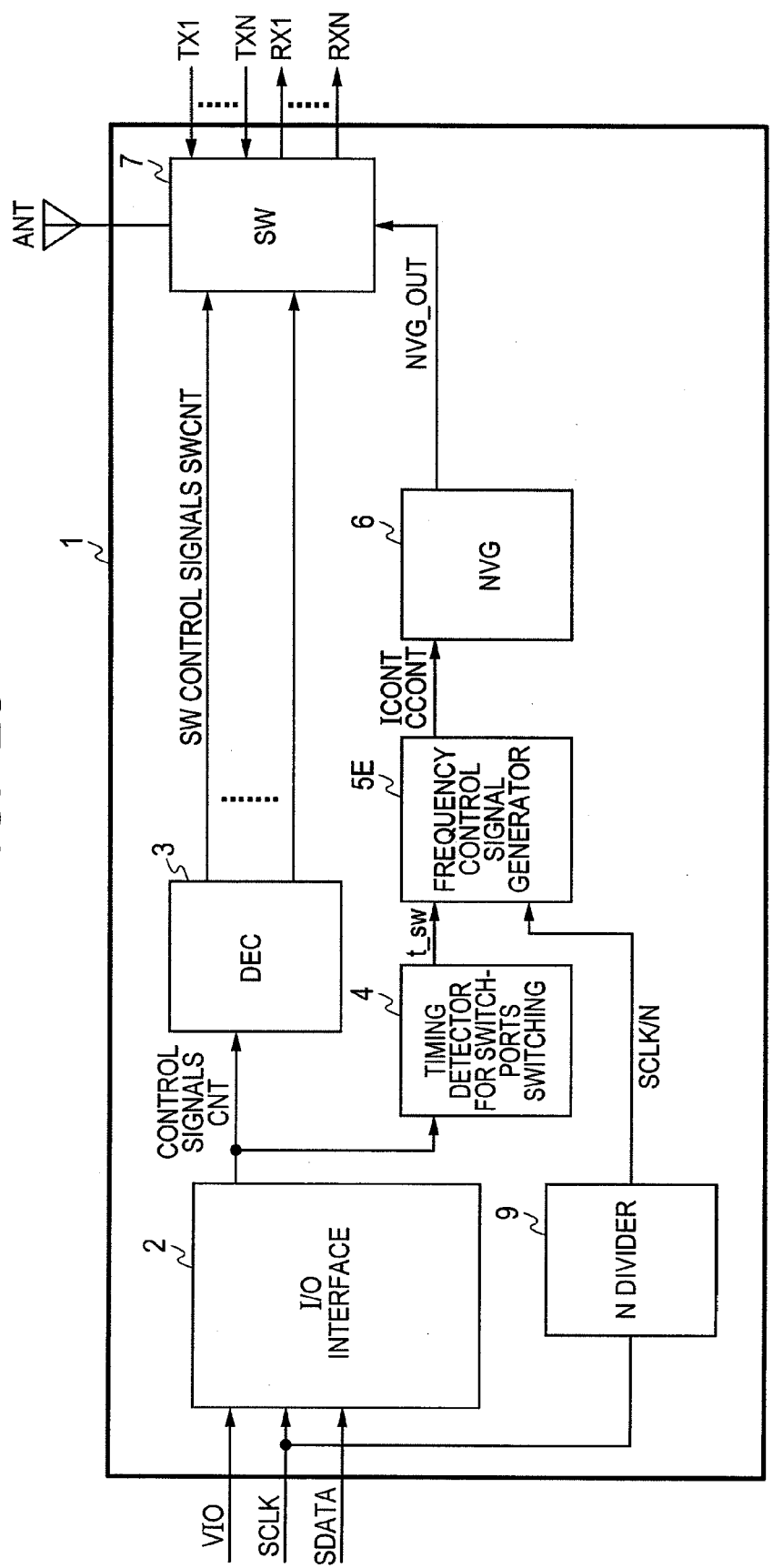
FIG. 28 illustrates the configuration of the high frequency antenna switch module of the fifth embodiment of the present invention.

Next, a high frequency antenna switch module according to a sixth embodiment of the present invention will be described. FIG. 28 is a diagram illustrating the configuration of a high frequency antenna switch module (1) of the sixth embodiment of the present invention.

The high frequency antenna switch module (1) illustrated in FIG. 28 is a modification of the first embodiment of the invention shown in FIG. 1 and, in a manner similar to the first embodiment, includes the I/O interface (2), the decoder (3), the timing detector for switch-ports switching (4), a frequency control signal generator (5E), the negative voltage generation circuit (6), the switch (7), and an N frequency divider (9).

The N frequency divider (9) of FIG. 28 receives the system clock SCLK From the outside of the high frequency antenna switch module (1), generates a frequency division signal SCLK/N obtained by dividing the clock frequency of SCLK by N, and transfers the frequency division signal SCLK/N to the frequency control signal generator (5E). Since the system clock SCLK is usually generated from a quartz oscillator on a portable terminal substrate, its frequency precision is extremely high, and the frequency division signal SCLK/N also has extremely high frequency precision. In the frequency control signal generator (5E), as the clock signals of N clocks counted by the N counter (52) described in the first embodiment, by replacing the clock signal CLK_OUT of the clock generator (61) in the negative voltage generation circuit (6) of the first embodiment with the frequency division signal SCLK/N, the period in which the clock generator (61) increases the frequency can be specified with extremely high precision.

Internal Operation of High Frequency Antenna Switch Module 1

Figure 29:
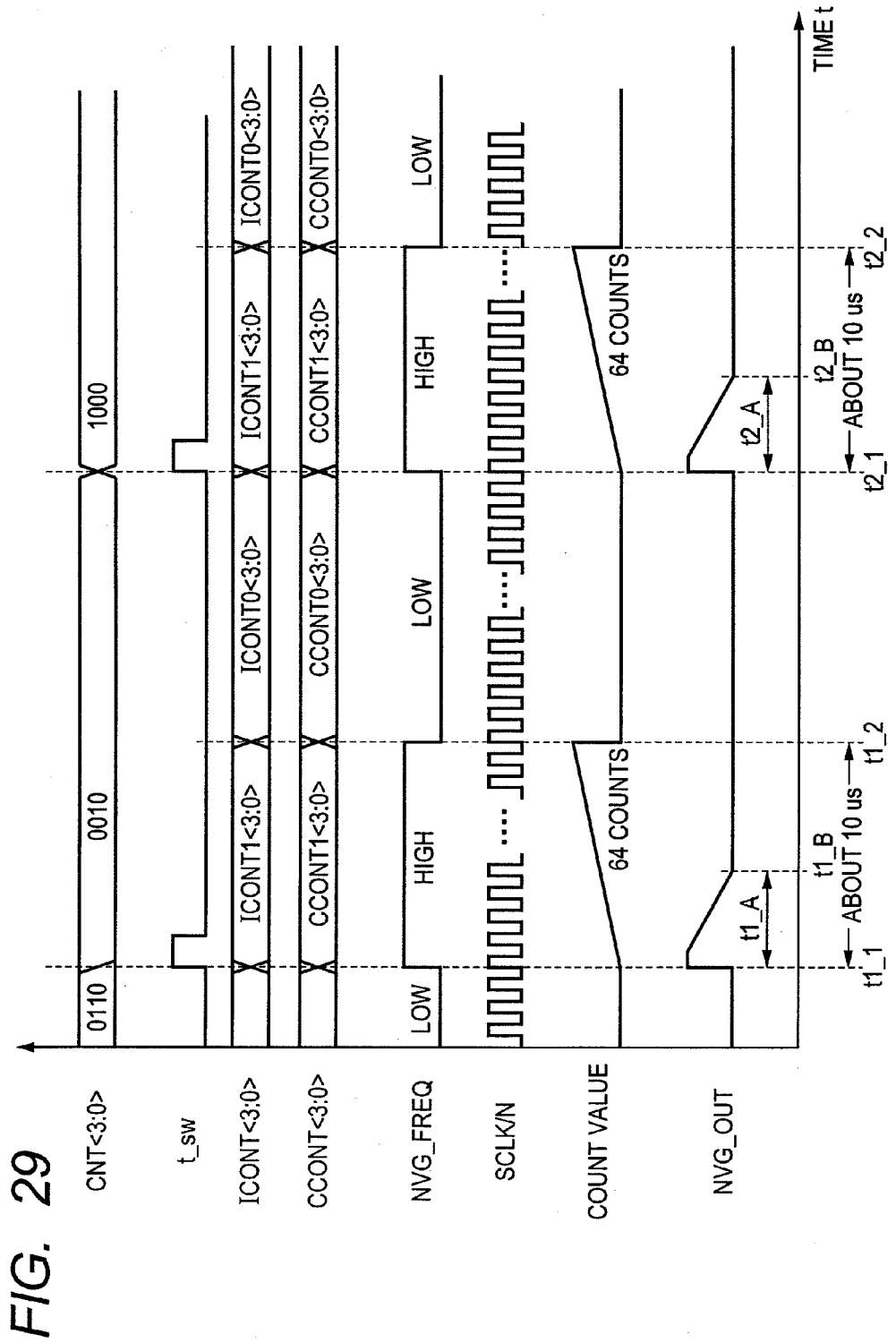
FIG. 29 is a timing chart illustrating the internal operation of the high frequency antenna switch module of the fifth embodiment of the present invention.
Figure 30A:
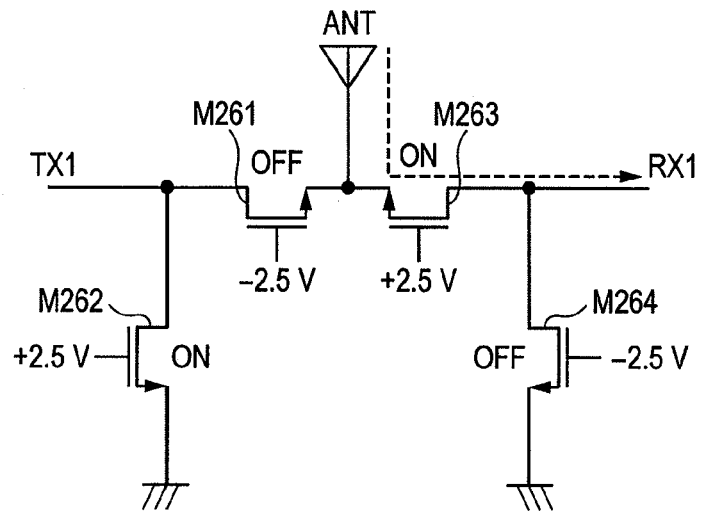
FIG. 30A is a diagram for explaining the operation principle of a reception system of a general SPDT switch.
Figure 30B:
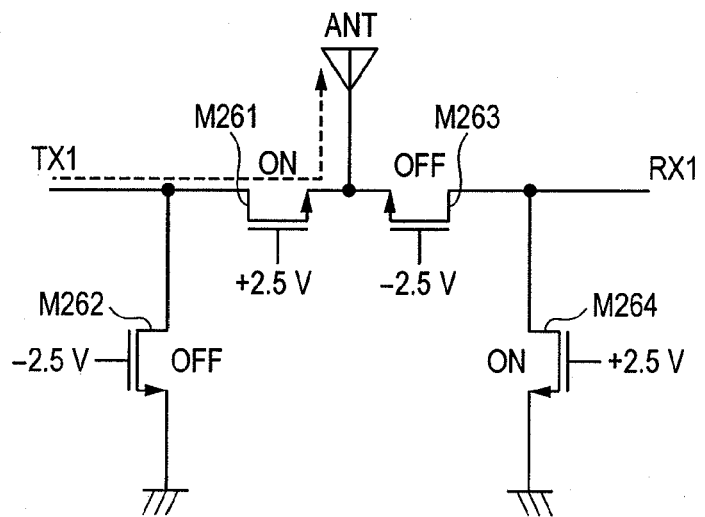
FIG. 30B is a diagram for explaining the operation principle of a transmission system of a general SPDT switch.
Figure 31:
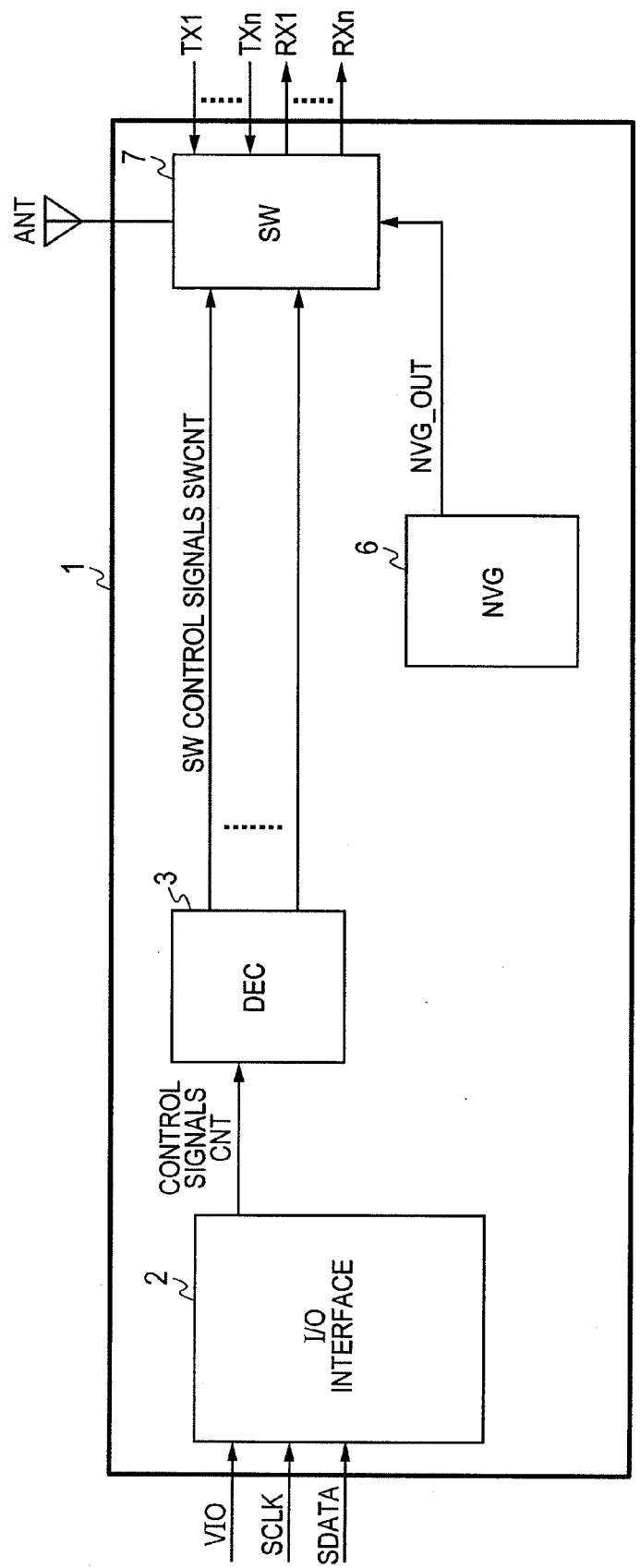
FIG. 31 is a diagram illustrating a configuration example of a conventional high frequency antenna switch module.

FIG. 29 is a diagram showing waveforms of internal parts, to explain the internal operation of the high frequency antenna switch module 1 of the sixth embodiment of the invention described with reference to FIG. 28. The uppermost waveform in FIG. 29 is of the output control signal CNT of the I/O interface (2). At the timing when the control signal CNT changes from "0110" to "0010" at the timing t=t1_1, the switch-ports switching timing detection signal t_sw of the second timing detector for switch-ports switching becomes the high level. On the other hand, since the control signal CNT changes from "0110" to "0010", the positive charges Cgs·VDD accumulated in a gate-source capacitor Cgs of a transistor for switching the switch ports in the switch core (70) flow in the charging capacitor Cc in the negative voltage generation circuit (6), and the negative charges in Cc are cancelled. Consequently, the negative voltage value of the negative voltage output signal NVG_OUT rises (close to 0 V). However, at almost the same timing as the timing when the negative voltage value of NVG_OUT increases, as the frequency control signals ICONT<3:0> and CCONT<3:0>, ICONT1<3:0> and CCONT1<3:0> are output, and the clock frequency of the clock generator (61) in the negative voltage generation circuit (6) increases. By the operation, rise of the negative voltage output signal NVG_OUT can be promptly reset to the original negative voltage value. On the other hand, at the timing when t_sw becomes the high level, the 64 counter in the frequency control signal generator (5E) starts counting the number of clocks of the N frequency division signal SCLK/N of the system clocks SCLK received from the outside of the high frequency antenna switch module (1). At the timing when 64 clocks are counted, that is, at the timing of t=t1_2 in FIG. 29, the frequency control signals ICONT<3:0> and CCONT<3:0> are reset to ICONT0<3:0> and CCONT0<3:0> as the values before t=t_t1. After that, similar operations are repeated also when the control signal CNT changes at t=t2_1.

In the high frequency antenna switch module (1) of the sixth embodiment of the invention described above, the switching timing of the switch can be instantaneously detected. Consequently, the clock frequency of the clock generator (61) can be increased at almost the same timing as actual switch of the switch ports of the switch (7), and the period in which the clock frequency increases can be regulated to predetermined time. Rise in the negative voltage output signal NVG_OUT accompanying the switch-ports switching of the switch (7) can be promptly reset to the original negative voltage value without increasing the capacitance values of the charging capacitor Cc and the transmission capacitor Ct. As a result, the high frequency antenna switch module satisfying effects of shortening of time of switch-ports switching, reduction in power consumption, and reduction of the area of the semiconductor chip can be realized.

Although the present invention achieved by the inventors herein has been concretely described on the basis of the various embodiments, obviously, the invention is not limited to the embodiments but can be variously changed without departing from the gist.

For example, the portable terminal is not limited to a cellular phone. The invention can be applied not only to a multi-band multi-mode wireless LAN transmitter/receiver or a system using negative voltage but also to a semiconductor memory as a recording medium using boosted voltage.

What is claimed is:

1. A high frequency antenna switch module having a switch for switching paths among a plurality of switch ports, the module comprising:
   an I/O interface for generating a plural kinds of control signals for controlling the switch module on the basis of a system data signal and a system clock received from external devices;
   a decoder for generating a switch control signal for controlling the switch ports of the switch in response to a control signal to switch the switch ports in the plural kinds of control signals;
   a timing detector for switch-ports switching for generating a switch-ports switching timing detection signal in response to a switching timing of the control signal to switch the switch ports;
   a frequency control signal generator for generating a plurality of frequency control signals for changing frequency in response to the switch-ports switching timing detection signal; and
   a negative voltage generation circuit for generating a clock signal of frequency which varies according to the frequency control signals and for generating a negative voltage output signal on the basis of the clock signal,
   wherein the negative voltage generation circuit temporarily increases the frequency of the clock signal at the switch-ports switching timing in response to the frequency control signals, and
   wherein the switch switches the paths among the plurality of switch ports in response to the switch control signal and the negative voltage output signal.

2. The high frequency antenna switch module according to claim 1, wherein the negative voltage generation circuit comprises a clock generator generating the clock signal of frequency which varies in response to the frequency control signals and a charge pump circuit receiving the clock signal and generating the negative voltage.

3. The high frequency antenna switch module according to claim 1, wherein a period of temporarily increasing the frequency of the clock signal is shorter than a period of a periodical switching timing of the switch ports and is equal to or longer than a period in which the negative voltage output signal is reset to an original negative voltage value before the switch-ports switching timing.

4. The high frequency antenna switch module according to claim 1, wherein the negative voltage generation circuit temporarily increases the frequency of the clock signal synchronously with the switch-ports switching timing in response to the frequency control signals.

5. The high frequency antenna switch module according to claim 1, wherein the frequency control signals generated from the frequency control signal generator has at least two control values, any one of the at least two control values is generated as a frequency control signal only for predetermined time in response to the switch-ports switching detection signal and, after lapse of the predetermined time, another control value is generated as another frequency control signal.

6. The high frequency antenna switch module according to claim 5, wherein the negative voltage generation circuit comprises a clock generator for generating clock signals of the different frequencies and a charge pump circuit for generating the negative voltage output signal using the clock signal as an input,
   wherein the frequency control signal generator has a counter for measuring N clocks, and
   wherein the predetermined time is time until N clocks are measured by the counter in response to clocks output from the clock generator in the negative voltage generation circuit.

7. The high frequency antenna switch module according to claim 1, wherein the frequency control signal generator generates the frequency control signals in response to the switch-ports switching detection signal,
   wherein the negative voltage generation circuit generates the negative voltage output signal while switching the frequency of the clock signal generated in the negative voltage generation circuit to two or more difference frequencies in response to the frequency control signals, and
   wherein the switch switches paths among a plurality of switch ports in response to the switch control signal and the negative voltage output signal,
   wherein the frequency control signal generator responds to a negative voltage value of the negative voltage output of the negative voltage generation circuit and a reference voltage value, and
   wherein the predetermined time is time until the negative voltage value reaches the reference voltage value.

8. The high frequency antenna switch module according to claim 1, wherein the frequency divider receives the system clock and generates a frequency division signal for dividing the system clock frequency by N (N>1),
   wherein the frequency control signal generator generates the frequency control signals having at least two control values, in response to the switch-ports switching detection signal, generates any one of the at least two control values as a frequency control signal only for predetermined time and, after lapse of the predetermined time, generates another control value as another frequency control signal,
   wherein the frequency control signal generator has a counter for measuring N clocks and,
   wherein the predetermined time is time until N clocks are counted by the counter in response to a frequency division signal of the frequency divider.

9. A high frequency antenna switch module having a switch for switching paths among a plurality of switch ports, the module comprising: an I/O interface for generating control signals for controlling the switch module on the basis of a system data signal and a system clock received from external devices and generating IO_EN as an activation signal indicating that the I/O interface is activated; a decoder for generating a switch control signal for controlling the switch port of the switch in response to a control signal to switch the switch port in the plural kinds of control signals; a timing detector for switch-ports switching for generating a switch-ports switching detection signal in response to a switching timing of the control signal to switch the switch port; a frequency control signal generator for generating a plurality of frequency control signals in response to the activation signal IO_EN and the switch-ports switching detection signal; and a negative voltage generation circuit for generating a clock signal of frequency which varies according to the frequency control signals and generating a negative voltage output signal on the basis of the clock signal, wherein the negative voltage generation circuit temporarily increases frequency of the clock signal before and after the switch-ports switching timing in response to the frequency control signals, and wherein the switch switches the paths among the plurality of switch ports in response to the switch control signal and the negative voltage output signal.

10. The high frequency antenna switch module according to claim 9, wherein a period of temporarily increasing the frequency of the clock signal is shorter than a period of a periodical switching timing of the switch ports and is equal to or longer than a period in which the negative voltage output signal returns to an original negative voltage value before the switch-ports switching timing.

11. The high frequency antenna switch module according to claim 9, wherein the negative voltage generation circuit comprises a clock generator for generating clock signals of the different frequencies and a charge pump circuit for generating the negative voltage output signal using the clock signal as an input, and
wherein the negative voltage generation circuit temporarily increases the frequency of the clock signal synchronously with the activation signal IO_EN in response to the frequency control signals.

12. The high frequency antenna switch module according to claim 9, wherein the frequency control signals generated from the frequency control signal generator has at least two control values, and
wherein the frequency control signal generator generates any one of the at least two control values as a frequency control signal only for predetermined time in response to the activation signal IO_EN and, after lapse of the predetermined time, generates another control value as another frequency control signal.

13. The high frequency antenna switch module according to claim 12, wherein the frequency control signal generator has a counter for measuring N pieces of clocks, and
wherein the predetermined time is time since counting of the number of clocks which are output by the counter starts at a timing at which the switch-ports switching detection signal is detected until N clocks are measured by the counter in response to clocks output from the clock generator in the negative voltage generation circuit.

14. The high frequency antenna switch module according to claim 9, wherein the I/O interface generates the control signals for controlling the switch module and generates IO_EN as an activation signal indicating that the I/O interface is activated on the basis of the system data signal received from the external devices of the switch module and the system clock,
wherein the module further comprises a switching pattern detector for generating a switching pattern detection signal in response to a switching pattern of a control signal to switch the switch port in the control signals, and
wherein the frequency control signal generator generates the frequency control signals in response to the activation signal IO_EN, the switch-ports switching detection signal, and the switching pattern detection signal.

15. The high frequency antenna switch module according to claim 14, wherein the frequency control signal generator generates the frequency control signals having at least three control values, generates any one of the at least three control values as a frequency control signal only for predetermined time in response to the switch-ports switching detection signal and the switch-ports switching pattern detector and, after lapse of the predetermined time, generates another control value as another frequency control signal.

16. The high frequency antenna switch module according to claim 15, wherein the frequency control signal generator has a counter for measuring N pieces of clocks, and
wherein the predetermined time is time since counting of the number of clocks which are output by the counter starts at a timing at which the switch-ports switching detection signal is detected until N clocks are measured by the counter in response to clocks output from the clock generator in the negative voltage generation circuit.

17. A high frequency antenna switch module having a switch for switching paths among a plurality of switch ports, the module comprising an I/O interface, a decoder, a timing detector for switch-ports switching, a frequency control signal generator, a negative voltage generation circuit, and a switching pattern detector, wherein the I/O interface generates a plural kinds of control signals for controlling the switch module on the basis of a system data signal and a system clock received from external devices, wherein the decoder generates a switch control signal for controlling the switch in response to a control signal to switch the switch port in the plural kinds of control signals, wherein the timing detector for switch-ports switching generates a switch-ports switching detection signal in response to a switching timing of the control signal to switch the switch port, wherein the switching pattern detector generates a switching pattern detection signal in response to a switching pattern of a control signal to switch the switch port in the plurality of control signals, wherein the frequency control signal generator generates a plurality of frequency control signals in response to the switch-ports switching detection signal and the switching pattern detection signal, and wherein the negative voltage generation circuit generates a negative voltage output signal while switching the frequency of a clock signal generated in the negative voltage generation circuit to three or more different frequencies in response to the frequency control signals, wherein the negative voltage generation circuit temporarily increases frequency of the clock signal at the switch-ports switching timing in response to the frequency control signals, and wherein the switch switches the paths among the plurality of switch ports in response to the switch control signal and the negative voltage output signal.

18. The high frequency antenna switch module according to claim 17, wherein a period of temporarily increasing the frequency of the clock signal is shorter than a period of a periodical switching timing of the switch ports and is equal to or longer than a period in which the negative voltage output signal returns to an original negative voltage value before the switch-ports switching timing.

19. The high frequency antenna switch module according to claim 17, wherein the frequency control signals generated from the frequency control signal generator has at least three control values, any one of the at least three control values is generated as a frequency control signal only for predetermined time in response to the switch-ports switching detection signal and the switch-ports switching pattern detector and, after lapse of the predetermined time, another control value is generated as another frequency control signal.

20. The high frequency antenna switch module according to claim 19, wherein the negative voltage generation circuit comprises a clock generator generating clock signals of the different frequencies and a charge pump circuit generating the negative voltage output signal using the clock signal as an input,
- wherein the frequency control signal generator has a counter for measuring N pieces of clocks, and
- wherein the predetermined time is time until N clocks are measured by the counter in response to clocks output from the clock generator in the negative voltage generation circuit.

* * * * *